(12) United States Patent
Shibata

(10) Patent No.: US 7,172,822 B2
(45) Date of Patent: Feb. 6, 2007

(54) NETWORK CONDUCTOR AND ITS PRODUCTION METHOD AND USE

(75) Inventor: Takeshi Shibata, Kanagawa-ken (JP)

(73) Assignee: Fuji Photo Film Co., Ltd., Kanagawa-ken (JP)

(*) Notice: Subject to any disclaimer, the term of this patent is extended or adjusted under 35 U.S.C. 154(b) by 260 days.

(21) Appl. No.: 10/720,667

(22) Filed: Nov. 25, 2003

(65) Prior Publication Data

US 2004/0150326 A1    Aug. 5, 2004

(30) Foreign Application Priority Data

Nov. 25, 2002  (JP)  ............................. 2002-341093
Mar. 18, 2003  (JP)  ............................. 2003-074492

(51) Int. Cl.
  *B32B 3/00*   (2006.01)
  *H01J 1/62*   (2006.01)
  *H01J 9/00*   (2006.01)

(52) U.S. Cl. .................. 428/690; 428/917; 313/309; 313/310; 313/503; 313/509; 445/24; 445/50; 445/51

(58) Field of Classification Search ............... 313/503, 313/477, 309, 310, 509; 428/690, 917; 174/35; 445/24, 50, 51
See application file for complete search history.

(56) References Cited

U.S. PATENT DOCUMENTS

2002/0153824 A1* 10/2002 Chigusa et al. .......... 313/477 R
2004/0177982 A1*  9/2004 Shibata .................. 174/35 MS

FOREIGN PATENT DOCUMENTS

JP  10-012386   1/1998
JP  11-026140   1/1999

* cited by examiner

*Primary Examiner*—Rena Dye
*Assistant Examiner*—Camie S. Thompson
(74) *Attorney, Agent, or Firm*—Sughrue Mion, PLLC

(57) ABSTRACT

A network conductor has an irregular network structure with as thin lines as 10 nm to 10 μm. The network conductor is obtained by forming a thin film on a substrate; forming microcracks in a network manner in the thin film; and forming a layer of a conductive material in the microcracks. The network conductor can be used for a positive electrode and/or a negative electrode of an organic electroluminescence device.

16 Claims, 3 Drawing Sheets

NETWORK CONDUCTOR AND ITS PRODUCTION METHOD AND USE

FIELD OF THE INVENTION

The present invention relates to a network conductor having an excellent charge injection property, low resistivity, and high light transmittance, and producing method and uses thereof, particularly to a network conductor usable for an electrode of an organic electroluminescence device.

BACKGROUND OF THE INVENTION

Organic light-emitting devices such as organic electroluminescence devices (organic EL devices) can be easily applied to surface light-emitting devices, whereby much attention has been paid to the new optical devices. The organic light-emitting devices are specifically considered to be useful as an economical, solid emission-type, full color display device having a large emission area, or a writing light source arrays, etc., and have been actively studied. The organic light-emitting devices generally comprise a couple of electrodes (a transparent electrode and a back electrode), and a light-emitting layer disposed between the electrodes. When electric field is applied to the electrodes, electrons are injected from the back electrode and holes are injected from the transparent electrode to the light-emitting layer. The electrons and the holes are re-combined in the light-emitting layer, and the organic light-emitting device emits light such that the energy is converted into the light while the energy level is turned from a conduction band to a valence band.

In the organic EL devices, it is important that the negative electrode and the positive electrode are excellent in charge injection properties. When the charge injection properties are lower, the organic EL device needs a higher driving voltage to be poor in energy efficiency and driving durability. The charge injection properties are affected by work functions of conductive materials contained in the electrodes. The negative electrode desirably contains a conductive material with a low work function, and the positive electrode desirably contains a conductive material with a high work function. Further, the conductive material contained in each electrode is desirably light-transmittable. At least one of the negative electrode and the positive electrode has to be transparent to view an image from at least one surface of the organic EL device. The negative electrode is generally opaque or translucent because only metal materials have been known as materials having a low work function and excellent electroconductivity. Thus, the positive electrode is generally a transparent electrode comprising a metal oxide such as indium tin oxide (ITO), etc.

However, the work function of common ITO is approximately 4.7 eV. Though the work function of ITO can be increased by a surface treatment, it is approximately 4.9 eV at most. Further, because ITO has higher electric resistance as compared with metals, a charge injection-type light-emitting device such as the organic EL device using ITO disadvantageously produces brightness unevenness and generates heat with lower display quality, particularly in the case of using a transparent electrode with a large area. Thus, ITO is insufficient in the electric resistance and the work function though it has been most preferably used for the transparent electrode of the organic EL device. High-conductive materials such as gold are sufficient in the electric resistance and the work function, however, gold is absolutely disadvantageous in the light impermeability.

Under such circumstances, an organic EL device, which comprises a low resistant metal bus line (metal film) patterned by photolithography and a transparent conductive layer disposed on the metal bus line, has been proposed in JP 10-12386 A, etc.

However, the metal bus line is light-impermeable and reduces the light-emitting efficiency of the organic EL device. Further, the patterning of the metal bus line needs complicated processes. Though the reduction of the light-emitting efficiency can be effectively prevented by thinning the lines of the metal bus line, technologies capable of producing a thinner network conductive material lines in a large area with reduced costs are not known.

OBJECT OF THE INVENTION

Accordingly, an object of the present invention is to provide a network conductor having an excellent charge injection property, low resistivity and high light transmittance, and a producing method and uses thereof.

SUMMARY OF THE INVENTION

As a result of intense research in view of the above object, paying attention to natural phenomena of cracking, the inventor has found that utilizing microcracks generated in an irregular network pattern in a thin film, it is possible to provide a conductive material with an irregular network structure to show excellent charge injection property, low electric resistance and high light transmittance. The present invention has been accomplished by this finding.

Thus, the network conductor of the present invention has an irregular network structure with as thin lines as 10 nm to 10 μm.

The conductive material is preferably a metal, a metal oxide, or a conjugated polymer, more preferably a metal oxide such as ITO, copper, aluminum, nickel, iron, gold, silver, stainless steel, tungsten, chromium, or titanium.

The network conductor-having substrate of the present invention comprises a substrate and the above network conductor formed on the substrate. The network conductor-having substrate preferably comprises an underlayer between the substrate and the network conductor. The underlayer is preferably a plated underlayer or a bondable underlayer capable of having bondability to the conductive material. The network conductor-having substrate may comprise a thin film having network microcracks, in which the network conductor is formed, though the thin film is preferably removed after forming the network conductor. The thin film is preferably (1) a sol-gel film obtained by applying a sol-gel liquid, (2) a fine particle film obtained by applying a fine particles-containing liquid, or (3) a vapor deposition film obtained by depositing a vaporized thin film-forming material.

The organic electroluminescence device of the present invention comprises at least one network conductor-having substrate and an organic electroluminescence layer between a positive electrode and a negative electrode, wherein the network conductor has an irregular network structure with as thin lines as 10 nm to 10 μm, and constitutes the positive electrode and/or the negative electrode. When the positive electrode comprises the network conductor, the conductive material for the network conductor is preferably a material having a work function of 4.9 eV or more and a resistivity of $20 \times 10^{-6}$ Ω·cm or less, more preferably platinum, gold, cobalt, palladium, or an alloy thereof, most preferably gold. When the negative electrode comprises the network conductor, the conductive material for the network conductor is preferably a material having a work function of 4.6 eV or less and a resistivity of $20 \times 10^{-6}$ Ω·cm or less, more preferably Al, copper, silver, iron, tin, or an alloy thereof, most preferably silver. The network conductor is preferably covered with a conductive polymer layer.

The first method of the present invention for producing a network conductor comprises the steps of forming a thin film on a substrate; generating microcracks in a network manner in the thin film; and filling the microcracks with a conductive material.

The second method of the present invention for producing a network conductor comprises the steps of forming an underlayer on a substrate; forming a thin film on the underlayer, generating microcracks in a network manner in the thin film; activating portions of the underlayer exposed to the microcracks; removing the thin film; and forming a layer of a conductive material only on the activated portions of the underlayer.

In preferred examples of the first and second methods, the thin film is (1) a sol-gel film obtained by applying a sol-gel liquid, (2) a fine particle film obtained by applying a fine particles-containing liquid, or (3) a vapor deposition film obtained by depositing a vaporized thin film-forming material, and the microcracks are generated by drying the sol-gel film or the fine particle film, or by causing stress to be stored in the vapor deposition film during its growth.

In other preferred examples of the first and second methods, an underlayer is plated on the substrate, the thin film is formed on the plated underlayer, and the layer of the conductive material is formed by a plating method on (1) portions of the plated underlayer exposed in the microcracks or (2) the activated portions of the plated underlayer.

Specifically, a preferred method for producing the first network conductor comprises forming an underlayer by a plating method on the substrate, forming a thin film on the plated underlayer, generating microcracks in a network manner in the thin film, and forming a layer of a conductive material by a plating method on portions of the plated underlayer exposed to the microcracks.

A preferred method for producing the second network conductor comprises forming an underlayer by a plating method on a substrate, forming a thin film on the plated underlayer, generating microcracks in a network manner in the thin film, activating portions of the plated underlayer exposed to the microcracks, removing the thin film, and forming a layer of a conductive material by a plating method only on the activated portions of the plated underlayer.

When the plating method is an electroless plating method, the plated underlayer preferably comprises a plating catalyst or a catalyst precursor. When the plated underlayer comprises the catalyst precursor, the catalyst precursor is preferably activated. When the plating method is an electroplating method, the sheet resistance of the plated underlayer is preferably $10^{10}$ Ω/square or less.

In further preferred examples of the first and second methods, a bondable underlayer is formed on the substrate, the bondable underlayer is bondable to the conductive material or made bondable to the conductive material by an activating treatment, the thin film is formed on the bondable underlayer, and particles of the conductive material are bonded to (1) the portions of the bondable underlayer exposed in the microcracks or (2) the activated portions of the bondable underlayer.

Specifically, another preferred method for producing the first network conductor comprises forming a bondable underlayer having bondability to a conductive material or acquiring bondability to the conductive material by activation on a substrate, forming a thin film on the bondable underlayer, generating microcracks in a network manner in the thin film, and bonding particles of the conductive material to portions of the bondable underlayer exposed to the microcracks.

Another preferred method for producing the second network conductor comprises forming a bondable underlayer having bondability to a conductive material or acquiring bondability to the conductive material by activation on a substrate, forming a thin film on the bondable underlayer, generating microcracks in a network manner in the thin film, activating portions of the bondable underlayer exposed to the microcracks, removing the thin film, and bonding particles of the conductive material to the activated portions of the bondable underlayer.

It is preferred that the bondable underlayer contains a functional group bondable to the conductive material or a moiety that is converted to the functional group by the activating treatment.

DETAILED DESCRIPTION OF THE PREFERRED EMBODIMENTS

Figure 1:
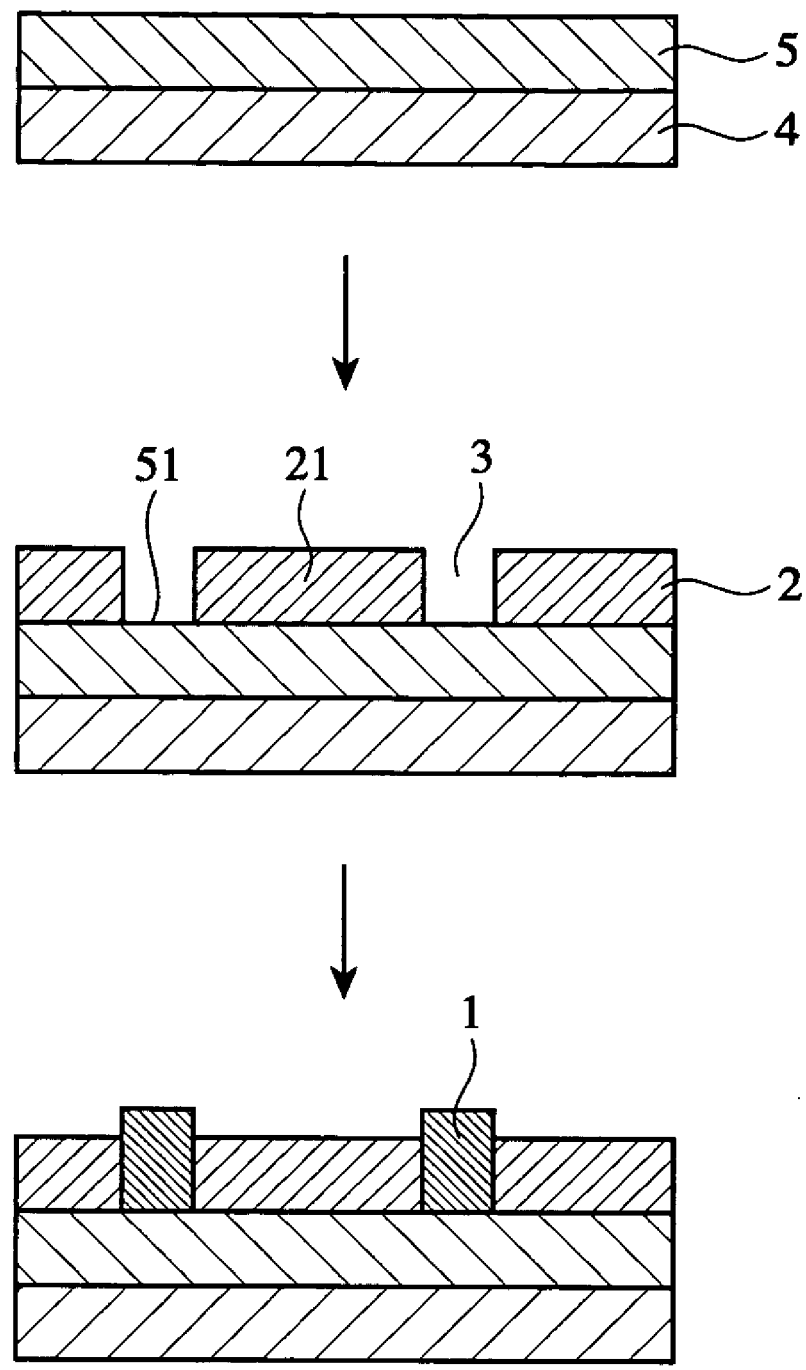
FIG. 1 is a flow chart showing an example of producing the network conductor of the present invention.

[1] Network Conductor and Network Conductor-having Substrate (1) Network Conductor The network conductor of the present invention has an irregular network structure. The irregular network structure corresponds to a structure of microcracks, produced when a thin film shrinks in the surface direction. The microcracks are two-dimensionally extends into a network (reticular), and the network conductor can be obtained by filling such microcracks with a conductive material using a plating method, etc. as described hereinafter. The microcracks has an extremely fine structure, which is, for example, similar to cracks of rice paddy produced when dried and shrunk in the surface direction.

Thin lines of the network conductor with the irregular network structure have a width (thin line width) of 10 nm to 10 μm. The thin line width is preferably 10 nm to 5 μm, more preferably 10 nm to 1 μm. When the thin line width is more than 10 μm, the network conductor is visually observed. When the thin line width is less than 10 nm, the network conductor has insufficient electroconductivity. It is preferable that the network conductor uniformly extends. The size of each mesh of the network conductor, which is the diameter of the circle equivalent to the mesh, is preferably within a range of 1 μm to 1 mm.

The network conductor comprises the conductive material, which is not particularly restricted and may be a metal, a metal oxide, a conjugated polymer, or a composite thereof. In the case where the network conductor needs to have a relatively high electroconductivity, metal oxides such as ITO, copper, aluminum, nickel, iron, gold, silver, stainless steels, tungsten, chromium, and titanium are effectively used as the conductive material. The conductive material may be a material for the transparent conductive layer to be hereinafter described.

(2) Network Conductor-having Substrate

The network conductor-having substrate of the present invention comprises a substrate and the network conductor of the invention formed thereon. The network conductor-having substrate may comprise a thin film having the network of the microcracks and the network conductor may be formed in the microcracks, though it is preferred that the network conductor-having substrate does not comprise the thin film. The thin film may be a sol-gel film, a fine particle film or a vapor deposition film as described hereinafter.

[2] Methods for Producing Network Conductor and Network Conductor-having Substrate The network conductor and the network conductor-having substrate according to the present invention can be produced by (a) a direct method comprising the steps of forming the thin film on a substrate; forming the network of the microcracks in the thin film; and filling the microcracks with the conductive material, or (b) an indirect method comprising the steps of forming an underlayer on a substrate; forming the thin film on the underlayer; forming the network of the microcracks in the thin film; subjecting the portions of the underlayer exposed in the microcracks to an activating treatment; removing the thin film; and forming the layer of the conductive material on only the activated portions of the underlayer.

(1) Formation of Thin Film

In the methods of the invention, the material and forming method of the thin film are not particularly limited as long as the thin film can form the microcracks on the substrate.

For example, it is often found in nature that mud (soil dispersed in water) in rice paddy, etc. is dried, shrunken in the surface direction, and finally cracked to form a particular pattern. In the case of artifacts, concrete is often cracked with time, and decorative crackles can be formed on pottery by selecting glaze. Industrially accessible materials and the prescription thereof may be selected applying the principles of these cracking phenomena to obtain the thin film capable of forming the microcracks. In the present invention, the material for the substrate may be selected from glasses, polymer films, metals, metal oxides, semiconductors, etc. depending on the use. The substrate preferably has surface smoothness. The thin film is mainly shrunken by the drying process due to the difference of heat expansion coefficient between the thin film and the substrate to form the microcracks. The shrinkage of the thin film is changed depending on the drying conditions, adhesion to the substrate, etc. Thus, the material for the thin film is selected in view of the material of the substrate, the surface properties of the substrate, the conditions for forming the microcracks, etc. In the invention, it is preferred that the thin film composed of a metal oxide, a metal nitride, a metal fluoride, fine polymer particles, fine semiconductor particles, fine metal particles, or fine particles of composite thereof is formed on the substrate by a sol-gel method, a method of applying fine particles, or a vapor growth method.

The microcracks on the thin film are preferably in a two-dimensionally continuous network shape. The sheet resistance of the network conductor becomes lower as the microcracks are more continuous. In the present invention, an isolated portion bounded by the microcracks is defined as "a domain". Thus, the thin film has a structure composed of the microcracks and the domains surrounded by the microcracks.

The shape and size of the domain may be optionally selected depending on the use. When the domain size is lowered, the light transmittance is reduced though the sheet resistance is also reduced effectively. Thus, the domain size is preferably controlled depending on the use. The width of the microcracks, which is closely related with the thin line width of the network conductor, is also selected depending on the use. The diameter of the circle equivalent to the domain is preferably 1 μm to 1 mm. The width of the microcracks is preferably 10 nm to 10 μm, more preferably 10 nm to 5 μm, particularly 10 nm to 1 μm. The sidewalls of the microcracks are preferably perpendicular to the surface of the substrate. In the case where the sidewall is inclined relative to the vertical direction (the thickness direction), or the microcracks are divided into several cracks in the thickness direction of the thin film, the surface uniformity of the network conductor and the light transmittance per the sheet resistance are occasionally reduced. In the case the underlayer is formed on the substrate, the underlayer is preferably exposed in the bottoms of the microcracks to easily form the network conductor by the plating method. The thickness of the thin film is preferably 10 nm to 10 μm, though it may be optionally selected depending on the use and the method of forming the network conductor.

The thin film may be formed by a known method. For example, the thin film may be formed by a sol-gel method or a method of applying fine particles, using a wet method such as a spin coating method, a gravure coating method, a dip-coating method, a casting method, a die coating method, a roll coating method, a bar coating method, an extrusion coating method, and an ink-jet coating method. Further, the thin film may be formed by a vapor growth method using a direct current sputtering method, a high frequency sputtering method, a vacuum deposition method, or an ion-plating method.

(1-1) Sol-gel Method

Embodiments of forming the sol-gel film as the thin film are described below. In the present invention, the sol-gel film is defined as a thin film, which is formed from a sol containing fine particles into a gel containing a solvent between the fine particles. The solvent between the fine particles is volatilized and thereby the thin film is shrunken in the surface direction, to provide the microcracks. The sol-gel film may comprise any organic or inorganic material that can form such a film. The sol-gel films are described in many books such as Sumio Sakka, *Science of Sol-Gel Method*, issued by Agune Shofusha (1988), and the materials for the films are also described therein. The sol-gel film can be relatively easily formed by using a sol-gel reaction wherein a metal alkoxide is hydrolyzed and condensed to obtain a metal oxide. Thus, the sol-gel film may be obtained by the steps of hydrolyzing the metal alkoxide in the presence of water or alcohol using an acid or base catalyst, applying the resulting solution, and drying the applied film.

In the present invention, the metal alkoxide is preferably hydrolyzed and polycondensed in the solution or the applied film to obtain a dense thin film. A resin may be used with the metal alkoxide to obtain a thin film composed of an organic-inorganic hybrid material.

The metal alkoxide may be an alkoxysilane, a metal alkoxide other than the alkoxysilane, or a combination thereof. The metal alkoxide other than the alkoxysilane is preferably selected from the group consisting of zirconium alkoxides, titanium alkoxides, and aluminum alkoxides.

The alkoxysilane used in the present invention is preferably represented by the following general formula (I): $Si(OR_1)_x(R_2)_{4-x}$. In the general formula (I), $R_1$ is preferably an alkyl group having a carbon number of 1 to 5 or an acyl group having a carbon number of 1 to 4, and examples thereof include a methyl group, an ethyl group, a n-propyl group, an i-propyl group, a n-butyl group, a sec-butyl group, a tert-butyl group, an acetyl group, etc. $R_2$ is preferably an organic group having a carbon number of 1 to 10, and examples thereof include unsubstituted hydrocarbon groups such as a methyl group, an ethyl group, a n-propyl group, an i-propyl group, a n-butyl group, a tert-butyl group, a n-hexyl group, a cyclohexyl group, a n-octyl group, a tert-octyl group, a n-decyl group, a phenyl group, a vinyl group, and an allyl group; and substituted hydrocarbon groups such as a γ-chloropropyl group, a $CF_3CH_2-$ group, a $CF_3CH_2CH_2-$ group, a $C_2F_5CH_2CH_2-$ group, a $C_3F_7CH_2CH_2CH_2-$ group, a $CF_3OCH_2CH_2CH_2-$ group, a $C_2F_5OCH_2CH_2CH_2-$ group, a $C_3F_7OCH_2CH_2CH_2-$ group, a $(CF_3)_2CHOCH_2CH_2CH_2-$ group, a $C_4F_9CH_2OCH_2CH_2CH_2-$ group, a 3-(perfluorocyclohexyloxy)propyl group, an $H(CF_2)_4CH_2OCH_2CH_2CH_2-$ group, an $H(CF_2)_4CH_2CH_2CH_2-$ group, a γ-glycidoxypropyl group, a γ-mercaptopropyl group, a 3,4-epoxycyclohexylethyl group, and a γ-methacryloyloxypropyl group. x is an integer of 2 to 4.

The specific examples of the alkoxysilanes are described below. The specific examples of the alkoxysilanes with x of 4 include tetramethoxysilane, tetraethoxysilane, tetra-n-propoxysilane, tetra-i-propoxysilane, tetra-n-butoxysilane, tetra-acetoxysilane, etc.

The specific examples of the alkoxysilanes with x of 3 include methyltrimethoxysilane, methyltriethoxysilane, ethyltrimethoxysilane, ethyltriethoxysilane, n-propyltrimethoxysilane, n-propyltriethoxysilane, i-propyltrimethoxysilane, i-propyltriethoxysilane, γ-chloropropyltrimethoxysilane, γ-chloropropyltriethoxysilane, γ-glycidoxypropyltrimethoxysilane, γ-glycidoxypropyltriethoxysilane, γ-methacryloyloxypropyltrimethoxysilane, γ-mercaptopropyltriethoxysilane, phenyltrimethoxysilane, vinyltriethoxysilane, 3,4-epoxycyclohexyethyltrimethoxysilane, 3,4-epoxycyclohexylethyltriethoxysilane, $CF_3CH_2CH_2Si(OCH_3)_3$, $C_2F_5CH_2CH_2Si(OCH_3)_3$, $C_2F_5OCH_2CH_2CH_2Si(OCH_3)_3$, $C_3F_7OCH_2CH_2CH_2Si(OC_2H_5)_3$, $(CF_3)_2CHOCH_2CH_2CH_2Si(OCH_3)_3$, $C_4F_9CH_2OCH_2CH_2CH_2Si(OCH_3)_3$, $H(CF_2)_4CH_2OCH_2CH_2CH_2Si(OCH_3)_3$, 3-(perfluorocyclohexyloxy)propyltrimethoxysilane, etc.

The specific examples of the alkoxysilanes with x of 2 include dimethyldimethoxysilane, dimethyldiethoxysilane, methylphenyldimethoxysilane, diethyldimethoxysilane, diethyldiethoxysilane, di-n-propyldimethoxysilane, di-n-propyldiethoxysilane, di-i-propyldimethoxysilane, di-i-propyldiethoxysilane, diphenyldimethoxysilane, divinyldiethoxysilane, $(CF_3CH_2CH_2)_2Si(OCH_3)_2$, $(C_3F_7OCH_2CH_2CH_2)_2Si(OCH_3)_2$, $[H(CF_2)_6CH_2OCH_2CH_2CH_2]_2Si(OCH_3)_2$, $(C_2F_5CH_2CH_2)_2Si(OCH_3)_2$, etc.

As described above, a resin (a polymer) may be used in the sol-gel reaction. The resin preferably has a group capable of forming a hydrogen bond, and examples of such resins include polymers having a hydroxyl group and derivatives thereof (e.g. polyvinyl alcohol, polyvinyl acetal, ethylene-vinyl alcohol copolymers, phenol resins, methylolmelamine, derivatives thereof, etc.); polymers having a carboxyl group and derivatives thereof (e.g. poly(meth)acrylic acid, homopolymers and copolymers containing a repeating unit of a polymerizable unsaturated acid such as maleic anhydride and itaconic acid, esterified products thereof containing a repeating unit of a vinyl ester such as vinyl acetate, a (meth)acrylic ester such as methyl methacrylate, etc.); polymers having an ether bond (e.g. polyalkylene oxides, polyoxyalkylene glycols, polyvinyl ethers, silicon resins, etc.); polymers having an amide bond (e.g. N-acylated products of polyoxazolines and polyalkylene imines having a $>N(COR_3)-$ bond in which $R_3$ represents a hydrogen atom, a substituted or unsubstituted alkyl group, or a substituted or unsubstituted aryl group, etc.); polyvinylpyrrolidones and derivatives thereof having a $>NC(O)-$ bond; polyurethanes; and polymers having a urea bond.

The resin may be a silyl-containing polymer. The silyl-containing polymer may have at least one silyl group containing a silicon atom connected to a hydrolyzable group and/or a hydroxyl group per one molecule in the end or the side chain, and preferably has a plurality of such silyl groups. The amount of the resin added in the sol-gel reaction is preferably 1 to 100 parts by weight per 100 parts by weight of the metal alkoxide or the mixture of the alkoxysilane and the other alkoxide.

A catalyst is preferably used in the sol-gel reaction to hydrolyze and polycondense the metal alkoxide in a solvent such as water and an organic solvent. The catalyst for the hydrolysis is generally an acid, which may be inorganic or organic. Examples of the inorganic acids include hydrochloric acid, hydrogen bromide, hydrogen iodide, sulfuric acid, sulfurous acid, nitric acid, nitrous acid, phosphoric acid, and phosphorous acid. Examples of the organic acids include carboxylic acids such as formic acid, acetic acid, propionic acid, butyric acid, succinic acid, cyclohexane carboxylic acid, octanoic acid, maleic acid, 2-chloropropionic acid, cyanoacetic acid, trifluoroacetic acid, perfluoroctanoic acid, benzoic acid, pentafluorobenzoic acid, and phthalic acid; sulfonic acids such as methanesulfonic acid, ethanesulfonic acid, trifluoromethanesulfonic acid, p-toluenesulfonic acid, and pentafluorobenzene sulfonic acid; phosphoric or phosphonic acids such as dimethyl phosphate and phenyl phosphonate; Lewis acids such as boron trifluoride etherate, scandium triflate, alkyltitanic acids, and aluminum hydroxide; and heteropolyacids such as phosphomolybdic acid and phosphotungstic acid.

The amount of the acid is preferably 0.0001 to 0.05 mol, more preferably 0.001 to 0.01 mol, per 1 mol of the metal alkoxide or the total of the alkoxysilane and the other alkoxides.

An inorganic base or an organic basic compound such as an amine may be added after the hydrolysis, thereby adjusting the pH value of the solution into around 7 to accelerate the polycondensation. The inorganic base may be sodium hydroxide, potassium hydroxide, calcium hydroxide, magnesium hydroxide, aluminum hydroxide, or ammonia, etc. Examples of the organic basic compounds include amines such as ethylenediamine, diethylenetriamine, triethylenetetramine, tetraethylenepentamine, triethylamine, dibutylamine, N,N-dimethylbenzylamine, tetramethylethylenediamine, piperidine, piperazine, morpholine, ethanolamine, diazabicycloundecenes, quinuclidine, aniline, and pyridine; phosphines such as triphenylphosphine and trimethylphosphine; etc.

The acid catalyst may be used with another sol-gel catalyst such as a metal chelate compound and an organic metal compound. The metal chelate compound preferably contains a central metal with a ligand of an alcohol represented by the following general formula (II): $R_4OH$, in which $R_4$ is an alkyl group having a carbon number of 1 to 6, or a diketone represented by the following general formula (III): $R_5COCH_2COR_6$, in which $R_5$ is an alkyl group having a carbon number of 1 to 6 and $R_6$ is an alkyl group having a carbon number of 1 to 6 or an alkoxy group having a carbon number of 1 to 16, without particular restrictions. Such preferred metal chelate compounds may be used in combination with each other. The metal chelate compound preferably has a central metal of Al, Ti, or Zr, and is particularly preferably represented by the following general formula (IV): $Zr(OR_4)_{p1}(R_5COCHCOR_6)_{p2}$, the general formula (V): $Ti(OR_4)_{q1}(R_5COCHCOR_6)_{q2}$, or the general formula (VI): $Al(OR_4)_{r1}(R_5COCHCOR_6)_{r2}$.

$R_4$ and $R_5$ in the metal chelate compound may be the same or different alkyl groups having a carbon number of 1 to 6, and the specific examples thereof include an ethyl group, a n-propyl group, an i-propyl group, a n-butyl group, a sec-butyl group, a t-butyl group, a n-pentyl group, a phenyl group, etc. $R_6$ is such an alkyl group having a carbon number of 1 to 6, or an alkoxy group having a carbon number of 1 to 16 such as a methoxy group, an ethoxy group, a n-propoxy group, an i-propoxy group, a n-butoxy group, a sec-butoxy group, a t-butoxy group, a lauryl group, and a stearyl group. Each of p1, p2, q1, q2, r1, and r2 in the general formulae (IV), (V), and (VI) is an integer selected such that the metal chelate compound is a 4 or 6-dentate coordination complex.

Specific examples of the metal chelate compounds include zirconium chelate compounds such as tri-n-butoxy mono(ethyl acetoacetato) zirconium, di-n-butoxy bis(ethyl acetoacetato) zirconium, n-butoxy tris(ethyl acetoacetato) zirconium, tetrakis(n-propylacetoacetato) zirconium, tetrakis(acetylacetoacetato) zirconium, and tetrakis(ethyl acetoacetato) zirconium; titanium chelate compounds such as diisopropoxy bis(ethyl acetoacetato) titanium, diisopropoxy bis(acetyl acetato) titanium, and diisopropoxy bis(acetyl acetone) titanium; and aluminum chelate compounds such as diisopropoxy mono(ethyl acetoacetato) aluminum, diisopropoxy mono(acetylacetonate) aluminum, isopropoxy bis (ethyl acetoacetato) aluminum, isopropoxy bis(acetylacetonato) aluminum, tris(ethyl acetoacetato) aluminum, tris (acetylacetonato) aluminum, and mono(acetylacetonato) bis (ethyl acetoacetato) aluminum. Preferred among the metal chelate compounds are tri-n-butoxy mono(ethyl acetoacetato) zirconium, diisopropoxy bis(acetylacetonato) titanium, diisopropoxy mono(ethyl acetoacetato) aluminum, and tris(ethyl acetoacetato) aluminum. These metal chelate compounds may be used singly or in combination. The metal chelate compounds may be partially hydrolyzed.

The organic metal compound as the catalyst for the sol-gel reaction is not particularly restricted. The organic metal compound is preferably a highly active, organic transition metal compound, more preferably a tin compound excellent in the stability and activity. Specific examples of such tin compounds include carboxylic acid-based tin compounds such as $(C_4H_9)_2Sn(OCOC_{11}H_{23})_2$, $(C_4H_9)_2Sn(OCOCH=CHCOOC_4H_9)_2$, $(C_8H_{17})_2Sn(OCOC_{11}H_{23})_2$, $(C_8H_{17})_2Sn(OCOCH=CHCOOC_4H_9)_2$, and $Sn(OCOCC_8H_{17})_2$; and ester-based tin compounds such as $(C_4H_9)_2Sn(SCH_2COOC_8H_{17})_2$, $(C_4H_9)_2Sn(SCH_2COOC_8H_{17})_2$, $(C_8H_{17})_2Sn(SCH_2CH_2COOC_8H_{17})_2$, and $(C_8H_{17})_2Sn(SCH_2COOC_{12}H_{25})_2$.

The shapes and sizes of the domains and the microcracks can be controlled by selecting the amount and addition timing of each agent, the reaction conditions (temperature, dilution ratio, etc.), the drying conditions (temperature, air quantity, etc.), the thickness, etc.

(1-2) Method of Applying Fine Particles

The thin film may be the fine particle film, which is formed by the method of applying fine particles. The fine particle film may be obtained by applying a fine particle dispersion liquid comprising the fine particles and a solvent, and by drying the applied liquid. Examples of materials for the fine particles include metal oxides such as $Al_2O_3$, $TiO_2$, ZnO, $CeO_2$, $Y_2O_3$, $SiO_2$, $SnO_2$, $ZrO_2$, $Fe_2O_3$, MgO, CuO, $Mn_3O_4$, ITO (Indium Tin Oxide), and ATO (Antimony Tin Oxide); polymers such as acrylics, polystyrenes, polymethyl methacrylates, polyethylenes, and polystyrene-butadienes; semiconductors such as CdS, CdSe, and ZnS; metals such as Au and Ag; and composites thereof. In the case where the thin film is not removed before or after the formation of the network conductor, the material for the fine particles is selected depending on the desired light transmittance of the thin film. The particle size of the fine particles is preferably 1 nm to 100 μm. The fine particles content of the dispersion liquid is preferably 0.1 to 70% by mass. The solvent contained in the fine particle dispersion liquid is preferably volatile, and may be an alcohol such as ethyl alcohol, an amide such as dimethylformamide, an organic solvent such as a sulfoxide solvent, water, etc.

After volatilizing the solvent, the fine particle film is preferably subjected to a heat treatment. The adhesion of the fine particle film to the substrate and the adhesion of the fine particles in the domains are increased by the heat treatment, whereby the conductive material can be applied to only the microcracks. The heating temperature may be selected depending on the fine particles. In the case of using the fine polymer particles, the heat treatment is preferably carried out at the temperature of Tg or higher.

(1-3) Vapor Growth Method

The thin film may be formed by the vapor growth method. In the vapor growth method, the microcracks are not formed by film shrinkage in drying process because the vapor deposition film contains no solvent, unlike in the case of the sol-gel method and the method of applying fine particles. In the vapor growth method, a material for the thin film is vaporized and deposited on the substrate, and the crystal growth of the material proceeds on the substrate, so that stress is accumulated in the deposited material to form the microcracks. The degree of cracking due to the accumulated stress can be controlled by selecting the conditions such as the temperature of the substrate, the thickness of the thin film, the material for the thin film, and the adhesion between the thin film and the substrate. Examples of the materials for the vapor deposition film include metal oxides, metal nitrides, metal fluorides, etc. Specific examples of the materials for the thin film include MgO, SiO, $SiO_2$, $Al_2O_3$, GeO, NiO, CaO, BaO, $Fe_2O_3$, $Y_2O_3$, $TiO_2$, silicon nitride, $MgF_2$, LiF, $AlF_3$, $CaF_2$, etc. The vapor growth method may utilize a vacuum deposition method, a sputtering method, an activated sputtering method, a molecular beam epitaxy method, a cluster ion beam method, an ion-plating method, a plasma polymerization method, a plasma CVD method, a laser CVD method, or a thermal CVD method, etc.

(1-4) Substrate

In the case of using the network conductor-having substrate in a display device, particularly an organic EL display device, the network conductor-having substrate needs to be shielded from air, moisture, etc. Thus, the substrate preferably has high transparency and excellent barrier property in this case, though there are no restrictions in the material of the substrate as described above. Specific examples of such substrates include glass substrates and transparent plastic films. The transparent plastic film is preferably filled with fine inorganic filler particles. The substrate such as the glass substrate and the transparent plastic film is preferably coated with an inorganic oxide having high transparency such as silicon oxide and silicon nitride.

The shape, structure, size, etc. of the substrate may be selected depending on the use. The substrate is generally in a plate shape, and the plate-shaped substrate preferably has a thickness of 5 µm to 5 mm. The substrate may have a single-layer structure or a multi-layer structure. Further, the substrate is preferably transparent and colorless, though it may be transparent and colored.

(1-5) Underlayer

The network conductor-having substrate preferably comprises an underlayer (an undercoating layer) as an intermediate layer between the substrate and the thin film (or the network conductor). By forming the underlayer, the surface properties of the substrate may be controlled, the adhesion of the thin film may be improved, and the network conductor can be easily formed. The network conductor may be formed by a plating method or a conductive particles-connecting method to be hereinafter described, and the underlayer is appropriately selected depending on the methods.

(a) Plated Underlayer

In the case of forming the network conductor by the plating method, it is effective that a plated underlayer is formed. The plated underlayer comprises a binder as a fundamental component. For example, in the case where the conductive material is deposited by an electroless plating method, the plated underlayer is preferably prepared by adding a plating catalyst to the binder; by adding a catalyst precursor, which can be activated by an after treatment, to the binder; by subjecting a binder layer to a surface-activating treatment; or by a combination thereof. The surface-activating treatment is preferably a surface-processing treatment, in which the binder layer is converted into such a surface state that the underlayer can be activated by the after treatment such as a chemical or physical treatment. Thus, the network conductor can be formed by the electroless plating method on only the portions exposed in the microcracks of the plated underlayer. In the case of forming the network conductor by an electroplating method, the plated underlayer preferably has electroconductivity. Because the plated underlayer having electroconductivity can be electrified, the network conductor can be formed by the electroplating method on only the portions exposed in the microcracks of the plated underlayer.

The plated underlayer may be patterned. The patterning method is not particularly limited, and may be a wet method such as a photolithography method, an ink-jet method, a printing method, and a transferring method. In an organic EL device using the network conductor-having substrate of the present invention, the pattern of the plated underlayer preferably corresponds to the pattern of the transparent conductive layer.

Examples of the binders for the plated underlayer include polymer binders such as polyvinyl chlorides, polycarbonates, polystyrenes, polymethyl methacrylates, polybutyl methacrylates, polyesters, polysulfones, polyphenylene oxides, polybutadienes, hydrocarbon resins, ketone resins, phenoxy resins, polyamides, polyvinyl acetates, ABS resins, polyurethanes, melamine resins, unsaturated polyesters, alkyd resins, epoxy resins, silicone resins, polyvinyl butyrals, polyvinyl acetals, polyvinyl alcohols, polyvinyl pyrrolidones, and polyacrylamides; proteins such as gelatins and derivatives thereof; cellulose derivatives such as ethylcellulose; and natural compounds such as starches, gum arabic, dextrans, and pullulans.

There are no particularly restrictions in the catalyst contained in the plated underlayer and the method of adding the catalyst. For example, the catalyst may be adsorbed to the binder layer by soaking the binder layer in a Pd catalyst solution as common electroless plating method, and the catalyst of reducing metal particles may be added to the binder layer. Preferred is the method of adding the reducing metal particles to the binder layer. The metal and particle size of the reducing metal particles is not restricted, as long as the reducing metal particles are colloidal particles that have a plating catalytic activity and can be uniformly dispersed in the thin film. The reducing metal particles are preferably colloidal particles containing a metal of Group VIII of the Periodic Table of Elements (Ni, Co, Rh, Pd, etc.), more preferably colloidal reducing Pd particles. The reducing metal particles may be added to the binder layer by a method in which a colloidal dispersion containing the reducing metal particles is added to the binder layer; a method in which a precursor of the reducing metal particles is added to the binder layer and the reducing metal particles are precipitated; or a method in which fine silver particles are added to the binder layer and brought into contact with Pd ions in an after treatment to precipitate reducing Pd, like Omnishield SST Process (Shipley Far East Ltd.).

In the case where the plated underlayer is electrified and thereby the layer of the conductive material is formed by electroplating, the plated underlayer is preferably semiconductive. In the invention, the term "semiconductive plated underlayer" means a plated underlayer having a sheet resistance of $10^{10}$ Ω/square or less. The semiconductive plated underlayer may be formed by adding a low or high molecular weight antistatic agent, a conductive polymer, a metal filler, carbon, etc. to the plated underlayer, or by using a semiconductive metal oxide or metal thin film as the material of the plated underlayer.

The plated underlayer may be subjected to a treatment of activating the plating catalyst or increasing the adhesion to the thin film. The treatment may be a chemical treatment such as an acid-alkali treatment, or a physical treatment such as UV irradiation, an oxygen plasma treatment, a hydrogen plasma treatment, and a corona treatment.

(b) Bondable Underlayer

In the case where the network conductor is formed by the conductive particle-connecting method, it is effective that the underlayer is a bondable underlayer having bondability to the conductive particles. The bondable underlayer comprises a binder as a fundamental component. For example, the bondable underlayer is preferably a layer comprising a binder with the bondability to the conductive particles; a layer prepared by adding a substance with the bondability to the conductive particles, such as inorganic or organic particles, to the binder; a layer prepared by subjecting the binder layer to a surface-activating treatment such as a chemical treatment and a physical treatment using light or heat energy; or a combination thereof.

The binder for the bondable underlayer may be the same as the binder for the plated underlayer. Further, the binder for the bondable underlayer may be a known hardening resin such as a heat-hardening resin and an active energy ray-curable resin. Examples of the heat-hardening resins include resins utilizing a crosslinking reaction of a prepolymer such as a melamine resin, a urethane resin, and an epoxy resin. The active energy ray-curable resin may be a polyfunctional monomer, and examples thereof include active energy ray-curable compounds such as a polyfunctional acrylate or methacrylate (e.g. pentaerythritol tetra(meth)acrylate, dipentaerythritol hexa(meth)acrylate, trimethylolpropane tri (meth)acrylate, etc.) The active energy ray may be ultraviolet ray, electron ray, gamma ray, etc., preferably ultraviolet ray. In the case where the active energy ray-curable resin is hardened by ultraviolet ray irradiation, a polymerization initiator is preferably added to the resin if necessary.

In the case of adding the substance with the bondability to the conductive particles to the binder, the substance is preferably a silane coupling agent having a functional group (a functional silane compound). The bondable underlayer can be formed by applying the silane coupling agent having a functional group onto the binder layer. The binder coated with the silane coupling agent shows the bondability to the conductive particles because of the functional group. The bondable underlayer may be formed by applying the silane coupling agent directly onto the substrate, to increase the adhesion between the bondable underlayer and the substrate.

The silane coupling agent contains a silicon atom, which is connected to at least an organic group having the functional group, and a hydrolyzable group or a hydroxyl group. The functional group may be a mercapto group, a primary amino group, a secondary amino group, a (meth)acryloyloxy group, an epoxy group, a vinyl group, a carboxy group, a chlorine group, an isocyanate group, etc. The organic group having the functional group is not hydrolyzable because the organic group is connected to the silicon atom at a carbon atom. The silicon atom may be bonded to an organic group having no functional group, which is preferably a lower alkyl group having a carbon number of 4 or less such as a methyl group, or a phenyl group.

In the organic group having the functional group, a moiety other than the functional group (a moiety between the functional group and the silicon atom) is preferably a divalent organic group such as an alkylene group, a phenylene group, a cycloalkylene group, and a combination thereof. In the divalent organic group, carbon atoms other than the terminal carbon atoms may be substituted by an ether oxygen atom. The divalent organic group is preferably an alkylene group, more preferably an alkylene group having a carbon number of 2 to 8, most preferably trimethylene group.

The functional group may be bonded to the end of the divalent organic group directly or through a polyvalent group or atom other than a carbon atom. For example, the functional group may be connected to the divalent organic group through a bond such as an ester bond, an ether bond, and an amide bond. Examples of the organic groups having the functional group include a mercaptopropylene group, a vinyl group, a 3-(4-vinylphenyl)propyl group, a 3-(meth) acryloylpropyl group, a 3-glycidoxypropyl group, a 2-(3,4-epoxycyclohexyl)ethyl group, a 3-aminopropyl group, an N-(2-aminoethyl)-3-aminopropyl group, an N-allyl-3-aminopropyl group, an N-phenyl-3-aminopropyl group, a 3-chloropropyl group, a 3-isocyanatepropyl group, etc. without restrictions.

The hydrolyzable group bonded to the silicon atom can react with water to produce a silanol group. The hydrolyzable group may be a residue obtained by removing a hydrogen atom from a hydroxyl group of a hydroxyl-containing compound (e.g. an alkoxy group), an acyl group, an amino group, a halogen atom, an acetoxy group, etc. The hydrolyzable group is preferably an alkoxy group or a halogen atom, more preferably an alkoxy group having a carbon number of 4 or less, a chlorine atom, or a bromine atom, most preferably an alkoxy group having a carbon number of 4 or less. The functional silane compound may be a compound containing 2 or more silicon atoms such as a disiloxane derivative and a disilane derivative, though the functional silane compound generally contains one silicon atom. The functional silane compound preferably contains a silicon atom connected to 4 substituents, which include an organic group having a mercapto group, a hydrolyzable group, and 2 substituents selected from organic groups having no functional group and hydrolyzable groups. The bondability of the underlayer to a noble metal material with high electroconductivity can be improved by using the functional silane compound containing a mercapto group.

The functional silane compound containing a mercapto group (a mercaptosilane compound) is preferably represented by the following general formula (VII): $HS-R_7-SiX_n(R_8)_{3-n}$, in which $R_7$ is a divalent hydrocarbon group, $R_8$ is a monovalent hydrocarbon group, X is a hydroxyl group or a hydrolyzable group, and n is an integer of 1 to 3.

$R_7$ in the general formula (VII) is preferably an alkylene group having a carbon number of 2 to 6, more preferably a propylene group. $R_8$ is preferably an alkyl group having a carbon number of 4 or less, more preferably a methyl group or an ethyl group. X is preferably the above-mentioned hydrolyzable group, more preferably an alkoxy group having a carbon number of 4 or less, most preferably a methoxy group or an ethoxy group. n is preferably an integer of 2 or 3.

Examples of the mercaptosilane compounds represented by the general formula (VII) include $HS-CH_2CH_2CH_2-Si(OMe)_3$, $HS-CH_2CH_2CH_2-Si(OEt)_3$, $HS-CH_2CH_2CH_2-Si(OPr)_3$, $HS-CH_2CH_2CH_2-SiMe(OMe)_2$, $HS-CH_2CH_2CH_2-SiMe(OEt)_2$, $HS-CH_2CH_2CH_2-SiMe(OPr)_2$, $HS-CH_2CH_2CH_2-SiMe_2(OMe)$, $HS-CH_2CH_2CH_2-SiMe_2(OEt)$, $HS-CH_2CH_2CH_2-SiMe_2(OPr)$, $HS-CH_2CH_2CH_2-SiCl_3$, $HS-CH_2CH_2CH_2-SiBr_3$, $HS-CH_2CH_2CH_2-SiMeCl_2$, $HS-CH_2CH_2CH_2-SiMeBr_2$, $HS-CH_2CH_2CH_2-SiMe_2Cl$, $HS-CH_2CH_2CH_2-SiMe_2Br$, etc. In the formulae, Me represents a methyl group, Et represents an ethyl group, and Pr represents a n-propyl group.

The bondable underlayer may be patterned in the same manner as in the plated underlayer.

(2) Formation of Network Conductor

As described above, the conductive material for the network conductor of the present invention is not particularly restricted, and specific examples thereof include ones described in [1] (1). The network conductor comprising the conductive material may be formed by the plating method or the conductive particles-connecting method to be described below.

(2-1) Plating Method

The plating method may utilize electroless plating, electroplating, etc., which does not restrict the invention. The plating method may be a hot dipping method, a vacuum plating method such as a vacuum deposition method and an ion-plating method, etc. The plating methods are described in detail in *Plating Technique Handbook,* Plating Material Cooperative Society of Tokyo, Technical Committee, etc.

It is preferred that at least one conductive metal selected from the group consisting of copper, aluminum, nickel, iron, gold, silver, stainless steels, tungsten, chromium, and titanium is used for the network conductor by the plating method. The network conductor may be formed by plating different metals into a multilayer to improve the stability. The multilayer may be a known one, and for example, the network conductor may be formed by electroless-plating nickel and by electroless-plating gold on the nickel layer. Further, the network conductor may be formed by combining the electroplating and electroless plating of one or more metal material.

As described above, the network conductor of the present invention may be produced by (a) the direct method where the microcracks of the thin film are filled with the conductive material while maintaining the network structure of the thin film composed of the domains and the microcracks, or (b) the indirect method where the plated underlayer is formed between the substrate and the thin film, the portions of the plated underlayer exposed in the microcracks are subjected to the activating treatment while maintaining the network structure of the thin film composed of the domains and the microcracks, the thin film is then removed, and the conductive material is deposited on only the activated portions of the plated underlayer without the network structure of the thin film. Examples of forming the network conductors by the direct method and the indirect method are described below with reference to drawings.

In the direct method, as shown in FIG. 1, a plated underlayer 5 is formed on a substrate 4, a thin film 2 is formed on the plated underlayer 5, and a conductive material 1 is deposited by a plating method on exposed portions 51 in a network of microcracks 3 provided in the thin film 2. The thin film 2 has domains 21. In the direct method, the plating catalyst or the catalyst precursor that can be activated by an after treatment is preferably added to the plated underlayer beforehand. The after treatment is a treatment of activating the exposed portions 51 before the deposition of the conductive material 1.

Figure 2:
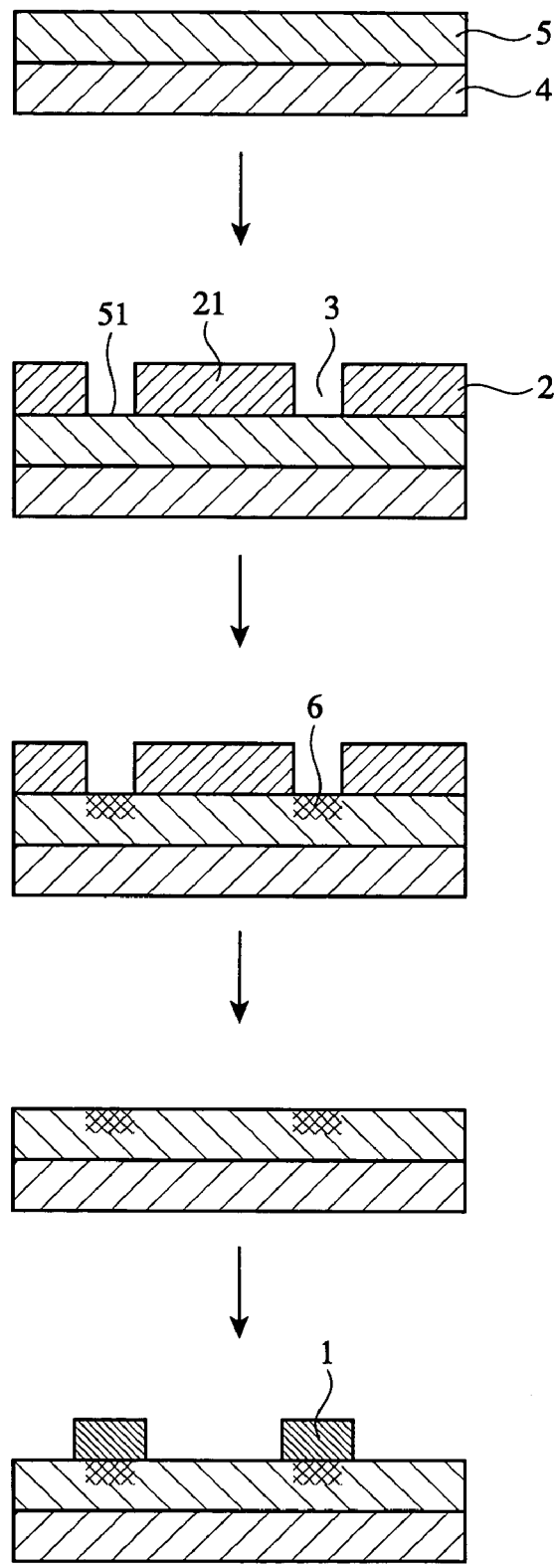
FIG. 2 is a flow chart showing another example of producing the network conductor of the present invention.

In the indirect method, as shown in FIG. 2, a plated underlayer 5 is formed on a substrate 4, a thin film 2 is formed on the plated underlayer 5, the exposed portions 51 in a network of microcracks 3 is subjected to an activating treatment, the thin film 2 is then removed, and a conductive material 1 is deposited on activated portions 6 by a plating method. It is preferred that the catalyst precursor that can be activated by an after treatment (a treatment of activating the exposed portions 51) is preferably added to the plated underlayer beforehand. Further, the plated underlayer is preferably subjected to a surface-processing treatment, to obtain a surface that can be activated by the after treatment such as a chemical treatment and a physical treatment. The chemical treatment may be an acid treatment, an alkali treatment, etc., and the physical treatment may be UV irradiation, an oxygen plasma treatment, a hydrogen plasma treatment, a corona treatment, etc.

The thickness of the network conductor formed by the plating method may be controlled by changing the composition or the plating conditions such as temperature and time, depending on the use. The thickness is preferably 0.01 to 10 μm.

In the case of using 2 or more conductive materials, it is effective that the direct method and the indirect method are used in combination. For example, a first layer of the network conductor may be formed by the direct method, and then, a second layer of the network conductor may be formed by the indirect method after the thin film is removed. The direct or indirect method may be selected depending on the use of the network conductor. The direct method is preferred from the viewpoint of controlling the thin line width of the network conductor, and the indirect method is preferred from the viewpoint of the surface uniformity and the density of the network conductor.

The network conductor-having substrate of the present invention is obtained by forming the network conductor on the substrate. A layer of another material may be stacked or stuck on the network conductor-having substrate. The thin film may be removed from the network conductor formed by the direct method.

The patterned network conductor may be produced by patterning the plated underlayer as described above. The network conductor may be patterned after plating, by a chemical etching method using photolithography, etc. or by a physical etching method using laser, etc.

(2-2) Conductive Particle-connecting Method

The conductive particles (particles composed of the conductive material) may comprise a conductive material, a composite of a plurality of conductive materials, or a composite of a conductive material with an insulating material or a semiconductor. Such conductive composite particles may have various forms and compositions, and examples thereof include particles of a mixture of different conductive materials such as alloys; particles having a core-shell structure of different materials, such as insulating particles coated with a conductive metal; chain or spherical secondary particles formed by agglutination of different primary particles; etc.

The conductive material for the conductive particles may be generally selected from (i) materials having electroconductivity due to free electrons in a metal bond; (ii) materials utilizing transfer of excess electrons for charge transfer; (iii) materials utilizing transfer of holes for charge transfer; (iv) organic polymers having electroconductivity due to interaction of π-bonds in a main chain; and (v) organic polymers utilizing interaction of groups in side chains for charge transfer. Specific examples of the materials of (i) to (iii) include metals and alloys such as zinc, aluminum, antimony, iridium, indium, gold, silver, chromium, cobalt, constantan, zirconium, copper, tin, tungsten, tantalum, iron, lead, nichrome, nickel, platinum, rhodium, palladium, beryllium, magnesium, manganin, molybdenum, alumel, chromel, and duralumin; metal oxides such as titanium oxide, tin oxide, iron oxide, antimony oxide, indium oxide, zirconium oxide, copper oxide, tungsten oxide, lead oxide, and bismuth oxide; carbonized tungsten such as tungsten carbide; and carbon black. Examples of the organic conductive polymers of (iv) and (v) include polyacetylene-based polymers, polyphenylene-based polymers, heterocycle-based polymers, and aromatic amine-based polymers. Specific examples of the polyacetylene-based polymers include polyacetylene and polyphenylacetylene, specific examples of the polyphenylene-based polymers include polyparaphenylene, polyphenylenevinylene, and thiophenylene-based polymers, specific examples of the heterocycle-based polymers include polypyrrole and polythiophene, and specific examples of the aromatic amine-based polymers include polyaniline and polydiaminoanthraquinone. The conductive particles preferably comprise at least one material selected form the group consisting of gold, silver, copper, and aluminum.

Examples of the insulating materials and the semiconductors usable for the conductive composite particles include oxides such as $Al_2O_3$ and $SiO_2$; polymers such as polyvinyl chlorides, polycarbonates, polystyrenes, polymethyl methacrylates, polybutyl methacrylates, polyesters, polysulfones, polyphenylene oxides, polybutadienes, hydrocarbon resins, ketone resins, phenoxy resins, polyamides, ethylcelluloses, polyvinyl acetates, ABS resins, polyurethanes, melamine resins, unsaturated polyesters, alkyd resins, epoxy resins, silicone resins, and polyvinyl butyrals; semiconductors such as CdS, CdSe, and ZnS; etc.

The average particle size of the conductive particles is preferably 0.001 to 100 μm, more preferably 0.005 to 10 μm. The conductive particles may be produced by known methods. For example, colloidal noble metal particles of gold, silver, etc. can be produced by a reductive reaction from a solution of the noble metal salt. The methods for producing fine particles of metals, alloys, or metal oxides are described in detail in Akio Kato and Hiromichi Arai, *Modern Applied Chemistry Series* 4, *Ultra-Fine Particles, Chemistry and Functions Thereof*, Asakura Shoten (1993), etc.

The conductive particles are connected and adhered to the bondable underlayer. The bondable underlayer may comprise a material with the bondability to the predetermined conductive particles, or the bondable underlayer may be a layer prepared by subjecting the binder layer to the surface-activating treatment. The bondability of the bondable underlayer is the ability of forming an ionic bond, a covalent bond, a hydrogen bond, or a van der Waals binding with the conductive particles. The higher the bondability is, the more the speed of filling the microcracks with the conductive particles becomes. The conductive particles may be surface-modified if necessary.

In the case of using conductive particles of a noble metal such as gold and silver, it is effective that thiol groups are immobilized in the bondable underlayer by the method described in (1)(1-5)(b). The network conductor may be produced by fixing a functional group such as a carboxylic acid group to the bondable underlayer, and by surface-modifying the noble metal particles using an alkanethiol having an amine group. Further, the network conductor may be produced by forming an anionic or cationic underlayer and by using conductive particles charged positively or negatively. In this method, the bondability between the conductive particles and the bondable underlayer is higher than the bondability between the conductive particles and the domains. Thus, the conductive particles are selectively adhered to the portions in the microcracks, thereby increasing the light transmittance of the network conductor.

The conductive particles may be adhered to the bondable underlayer by a solution method or a gas phase method. The solution method is preferred in the case where the conductive particles are connected to the substrate with a relatively large area. In the solution method, the substrate with the thin film may be soaked in a solution the conductive particles. The soaking temperature, the soaking time, the concentration of the solution, a solvent for the solution, etc. are not particularly restricted, and may be selected depending on the bondability between the conductive particles and the bondable underlayer. It is preferred that the substrate is dried at room temperature and then burned after the soaking. The burning temperature may be controlled depending on the materials of the conductive particles and the substrate. For example, gold particles may be connected to the bondable underlayer such that a glass substrate with a thin film is soaked in a solution containing colloidal gold particles at room temperature overnight, dried at room temperature, and burned at 300° C. for 1 hour.

The gas phase method for connecting the conductive particles may be a vacuum deposition method, a sputtering method, an activated sputtering method, a molecular beam epitaxy method, a cluster ion beam method, an ion-plating method, a plasma polymerization method, a plasma CVD method, a laser CVD method, a thermal CVD method, etc.

In both the solution method and the gas phase method, the conductive particles are preferably subjected to a surface treatment beforehand to improve the stability of the conductive particles. In the surface treatment, the conductive particles may be treated with a nonionic surfactant, a cationic surfactant, an anionic surfactant, a silicon-based coupling agent, an aluminum-based coupling agent, etc.

The conductive particle-connecting method may be the direct method or the indirect method as well as the plating method. Processes of the direct method and the indirect method of the conductive particle-connecting method are basically the same as those of the plating method. In the case of using the direct method, it is preferred that the substance with the bondability to the conductive particles is added to the bondable underlayer beforehand; the bondable underlayer comprises the binder with the bondability to the conductive particles; or the bondable underlayer is subjected to an activating treatment such as a chemical treatment and a physical treatment beforehand to increase the bondability. In the indirect method, the exposed portions of the bondable underlayer are preferably activated by a bondability-enhancing treatment such as a chemical treatment and a physical treatment. The chemical treatment may be such that a compound such as the silane coupling agent having a functional group is connected to the exposed portions of the binder layer in the microcracks. In this case, the underlayer preferably comprises a binder having a high affinity to the compound having a functional group.

[3] Organic Electroluminescence Device

The organic electroluminescence device (the organic EL device) of the present invention comprises the network conductor-having substrate of the invention. Organic light-emitting devices generally comprise a couple of electrodes (a back electrode and a transparent electrode) and a light-emitting layer formed therebetween. In the present invention, at least one of the electrodes comprises the network conductor of the invention. The organic EL device of the present invention may have a light-emitting lamination structure such as: network conductor layer (I)/organic electroluminescence layer/network conductor layer (II); network conductor layer (I)/transparent conductive layer/organic electroluminescence layer/network conductor layer (II); network conductor layer (I)/organic electroluminescence layer/back electrode/network conductor layer (II); transparent conductive layer/organic electroluminescence layer/network conductor layer; network conductor layer/organic electroluminescence layer/back electrode; network conductor layer/transparent conductive layer/organic electroluminescence layer/back electrode; network conductor layer (I)/transparent conductive layer/organic electroluminescence layer/back electrode/network conductor layer (II); transparent conductive layer/organic electroluminescence layer/back electrode/network conductor layer; network conductor layer (I)/conductive polymer layer/organic electroluminescence layer/conductive polymer layer/network conductor layer (II); network conductor layer (I)/conductive polymer layer/transparent conductive layer/organic electroluminescence layer/conductive polymer layer/network conductor layer (II); network conductor layer (I)/conductive polymer layer/organic electroluminescence layer/back electrode/conductive polymer layer/network conductor layer (II); transparent conductive layer/organic electroluminescence layer/conductive polymer layer/network conductor layer; network conductor layer/conductive polymer layer/organic electroluminescence layer/back electrode; network conductor layer/conductive polymer layer/transparent conductive layer/organic electroluminescence layer/back electrode; network conductor layer (I)/conductive polymer layer/transparent conductive layer/organic electroluminescence layer/back electrode/conductive polymer layer/network conductor layer (II); and transparent conductive layer/organic electroluminescence layer/back electrode/conductive polymer layer/network conductor layer.

The organic electroluminescence layer may have a structure such as a single layer structure of a light-emitting organic thin film; light-emitting organic thin film/electron-transporting organic thin film; hole-transporting organic thin film/light-emitting organic thin film/electron-transporting organic thin film; hole-transporting organic thin film/light-emitting organic thin film; light-emitting organic thin film/electron-transporting organic thin film/electron-injecting thin film; hole-injecting thin film/hole-transporting organic thin film/light-emitting organic thin film/electron-transporting organic thin film/electron-injecting thin film; etc.

The light-emitting organic thin film comprises a fluorescent compound or a phosphorescent compound. Light emission is generally allowed from the transparent conductive layer side. Examples of materials for each layer are described in "*Organic EL Display*" (Technotimes Co., Separate Volume of "*Monthly Display*", the October issue of 1998), etc.

(1) Substrate

Examples of materials for the substrate (support) include inorganic materials such as yttrium-stabilized zirconia (YSZ) and glasses; polymer materials such as polyesters (polyethylene terephthalate, polybutylene terephthalate, polyethylene naphthalate, etc.), polystyrenes, polycarbonates, polyethersulfones, polyarylates, allyldiglycolcarbonate, polyimides, polycyclolefins, norbornene resins; fluorine-containing polymer materials such as poly(chlorotrifluoroethylene), TEFLON (trademark) and polytetrafluoroethylene-polyethylene copolymers; etc. The substrate may be made of one material or a plurality of materials. The substrate is preferably composed of the polymer material and/or the fluorine-containing polymer material to produce a flexible organic EL device. The substrate is more preferably composed of at least one material selected from the group consisting of polyesters, polycarbonates, polyethersulfones, poly(chlorotrifluoroethylene), polycyclolefins, TEFLON (trademark), and polytetrafluoroethylene-polyethylene copolymers, which are excellent in heat resistance, dimensional stability, solvent resistance, insulation property and workability, and poor in gas permeability and hygroscopicity.

The substrate preferably has a heat deformation temperature of 140 to 360° C., a linear thermal expansion coefficient of $6.2 \times 10^{-5}$ cm/cm·° C. or less, a pencil hardness (JIS K 5400) of 2 H or more, a bending strength of 1,200 to 2,000 kgf/cm$^2$, a bend elastic constant of 30,000 to 50,000 kgf/cm$^2$, and a tensile strength of 700 to 1,200 kgf/cm$^2$.

The shape, structure, and size of the substrate may be appropriately selected in accordance with applications of the organic EL device. The substrate is generally in a plate shape, and the plate-shaped substrate preferably has a thickness of 5 to 5000 μm. The substrate may have a single-layer structure or a multi-layer structure. Further, though the substrate may be colored and transparent, the substrate is preferably colorless and transparent because such a substrate does not scatter or damp the light emitted from the light-emitting organic thin film.

A moisture permeation-inhibiting layer (a gas barrier layer) may be formed on the electrode side surface and/or the other side surface of the substrate. The moisture permeation-inhibiting layer preferably comprises an inorganic compound such as silicon nitride and silicon oxide. The moisture permeation-inhibiting layer may be formed by a radio frequency sputtering method, etc. Further, a hard coating layer and an undercoating layer may be disposed on the substrate, if necessary.

(2) Network Conductor Layer

The layer of the network conductor of the present invention is formed on the substrate. The methods for forming the network conductor are described above. Preferred materials of the network conductor for the organic electroluminescence device will be hereinafter described in detail.

(3) Positive Electrode and Negative Electrode

The network conductor of the present invention can be used as the positive electrode and/or the negative electrode, whereby at least one electrode comprises the layer of the network conductor. The positive electrode and the negative electrode may comprise only the network conductor layer, respectively. In the case of using the network conductor for the positive electrode, the network conductor may be combined with the transparent conductive layer, and the negative electrode may be composed of only the back electrode. In the case of using the network conductor for the negative electrode, the network conductor may be combined with the back electrode, and the positive electrode may be composed of only the transparent electrode. In the case where both of the positive electrode and the negative electrode are composed of only the network conductor layer, the formed image can be viewed from both the sides of the organic EL device. The structures of the positive electrode and the negative electrode may be determined depending on the compositions and applications of the organic EL device.

(3-1) Network Conductor Electrode

When the positive electrode comprises the network conductor of the present invention, the network conductor preferably comprises a conductive metal material having a work function of 4.9 eV or more and a resistivity of $20 \times 10^{-6}$ Ω·cm or less. Specific examples of the conductive metal materials include metals such as platinum (work function: 5.63 eV, resistivity: $10.6 \times 10^{-6}$ Ω·cm), gold (work function: 5.32 eV, resistivity: $2.35 \times 10^{-6}$ Ω·cm), cobalt (work function: 4.97 eV, resistivity: $6.24 \times 10^{-6}$ Ω·cm), and palladium (work function: 4.95 eV, resistivity: $10.8 \times 10^{-6}$ Ω·cm), and alloys thereof, and the examples do not restrict the scope of the present invention. Among the conductive metal materials, gold is most preferred.

When the negative electrode comprises the network conductor of the present invention, the network conductor preferably comprises a conductive material having a work function of 4.6 eV or less and a resistivity of $20 \times 10^{-6}$ Ω·cm or less. Specific examples of the conductive materials include metals such as Al (work function: 4.19 eV, resistivity: $2.65 \times 10^{-6}$ Ω·cm), copper (work function: 4.51 eV, resistivity: $1.67 \times 10^{-6}$ Ω·cm), silver (work function: 4.34 eV, resistivity: $1.59 \times 10^{-6}$ Ω·cm), iron (work function: 4.24 eV, resistivity: $9.71 \times 10^{-6}$ Ω·cm), and tin (work function: 4.42 eV, resistivity: $1.59 \times 10^{-6}$ Ω·cm), and alloys thereof, and the examples do not restrict the scope of the present invention. Among the conductive materials, silver is most preferred.

The network conductor of the present invention is preferably laminated with another conductive material to obtain an electrode capable of uniformly emitting light, though it may be singly used as an electrode. It is preferred that the other conductive material is excellent in adhesion to the network conductor and formability, and thus, conductive polymers are preferably used as the material. Examples of the conductive polymers include polyacetylene-based polymers, polyphenylene-based polymers, heterocycle-based polymers, and aromatic amine-based polymers. Specific examples of the polyacetylene-based polymers include polyacetylene and polyphenylacetylene, specific examples of the polyphenylene-based polymers include polyparaphenylene, polyphenylenevinylene, and thiophenylene-based polymers, specific examples of the heterocycle-based polymers include polypyrrole and polythiophene, and specific examples of the aromatic amine-based polymers include polyaniline and polydiaminoanthraquinone.

(3-2) Transparent Conductive Layer (Transparent Electrode)

The transparent conductive layer generally acts to supply holes to the organic thin films as a positive electrode, and may act as a negative electrode. Thus, the transparent conductive layer may be used as the negative electrode or the positive electrode in accordance with the components of the organic EL device. The explanations will be made with respect to the case of using the transparent conductive layer as the positive electrode.

The shape, structure, and size of the transparent conductive layer are not particularly limited, and may be appropriately selected in accordance with applications and purposes of the organic EL device. The transparent conductive layer may be composed of a metal, an alloy, a metal oxide, an electrically conductive compound, a mixture thereof, etc. The transparent conductive layer is preferably composed of a material having a work function of 4 eV or more. Specific examples of the materials for the transparent conductive layer include antimony-doped tin oxide (ATO); fluorine-doped tin oxide (FTO); semiconductive metal oxides such as tin oxide, zinc oxide, indium oxide, indium tin oxide (ITO) and indium zinc oxide (IZO); metals such as gold, silver, chromium and nickel; mixtures and laminations of the metals and conductive metal oxides; inorganic conductive materials such as copper iodide and copper sulfide; organic conductive materials such as polyaniline, polythiophene and polypyrrole; and laminations of the organic conductive materials and ITO. Particularly in the case of using a plastic substrate poor in heat resistance, it is preferable that the transparent conductive layer composed of ITO or IZO is formed at a low temperature of 150° C. or lower. Electrodes described in "*Tomei-Dodenmaku no Shintenkai (Development of the Transparent Conductive Film)*" supervised by Yutaka Sawada, CMC, Ink., 1999, etc. may be used as the transparent conductive layer in the organic EL device of the present invention.

The transparent conductive layer may be formed on the network conductor-having substrate by a wet method such as a printing method and a coating method; a physical method such as a vacuum deposition method, a sputtering method and an ion-plating method; a chemical method such as a CVD method and a plasma CVD method; etc. The method for forming the transparent conductive layer may be appropriately selected depending on the materials. For example, the transparent conductive layer of ITO may be formed by a direct sputtering method, an RF sputtering method, a vapor deposition method, an ion-plating method, etc. The transparent conductive layer of the organic conductive material may be formed by a wet method.

The transparent conductive layer may be patterned by a chemical etching method such as a photolithography, or by a physical etching method using laser, etc. Further, the transparent conductive layer may be patterned by a vacuum deposition or sputtering method using a mask, a lift-off method, a printing method, etc.

Although the position of the transparent conductive layer in the organic EL device may be appropriately selected in accordance with the applications of the EL device, the transparent conductive layer is preferably formed on the thin film containing the network conductor (or on the network conductor after removing the thin film). In the case where the conductive polymer layer described in (3-1) is disposed on the network conductor layer, the transparent conductive layer is preferably formed on the conductive polymer layer. In this case, the network conductor forms a lamination with the transparent conductive layer. The lamination of the transparent conductive layer with the thin film containing the network conductor (or with the network conductor) has a lower sheet resistance, as compared with the case where only the transparent conductive layer is formed on the substrate. The transparent conductive layer may be formed on the whole surface or a part of the network conductor.

The thickness of the transparent conductive layer may be properly controlled depending on the material. The thickness is generally 10 nm to 50 μm, preferably 50 nm to 20 μm. The resistance of the transparent conductive layer is preferably $10^3$ Ω/square or less, more preferably $10^2$ Ω/square or less. The transparent conductive layer may be colorless or colored. The light transmittance of the transparent conductive layer is preferably 60% or more, more preferably 70% or more, to allow light emission from the transparent conductive layer side. The light transmittance may be measured by a known method using a spectrophotometer.

(3-3) Back Electrode

The back electrode generally acts to supply electrons to the organic thin films as the negative electrode, and may act as the positive electrode. The explanations will be made with respect to the case of using the back electrode as the negative electrode.

The shape, structure, and size of the back electrode are not particularly limited and may be appropriately selected in accordance with the applications of the organic EL device. The back electrode may be composed of a metal, an alloy, a metal oxide, an electrically conductive compound, a mixture thereof, etc. The back electrode is preferably composed of a material having a work function of 4.5 eV or less. Examples of the materials used for the back electrode include alkaline metals such as Li, Na, K and Cs; alkaline earth metals such as Mg and Ca; gold; silver; lead; aluminum; sodium-potassium alloys; lithium-aluminum alloys; magnesium-silver alloys; indium; rare earth metals such as ytterbium; etc. It is preferable that the back electrode comprises a plurality of the materials to improve the stability and the electron injection property, though the materials may be used singly. Among the materials, the alkaline metals and alkaline earth metals are preferred from the viewpoint of the electron injection property, and aluminum-based materials are preferred from the viewpoint of the storage stability. The aluminum-based material may be simple substance of aluminum, or an alloy or a mixture comprising aluminum and 0.01 to 10% by mass of an alkaline metal or an alkaline earth metal such as a lithium-aluminum alloy and a magnesium-aluminum alloy. The back electrode may be composed of a material disclosed in JP 2-15595 A, JP 5-121172 A, etc.

The back electrode may be formed by a wet method such as a printing method and a coating method; a physical method such as a vacuum deposition method, a sputtering method, and an ion-plating methods; or a chemical method such as a CVD method and a plasma CVD method. The method for forming the back electrode may be appropriately selected depending on the material for the back electrode. In the case of using a plurality of metal materials for the back electrode, the materials may be spattered simultaneously or in order.

The back electrode may be patterned by a chemical etching method such as photolithography, or a physical etching method using laser, etc. Further, the back electrode may be patterned by a vacuum deposition or sputtering method using a mask, a lift-off method, a printing method, etc.

The position of the back electrode in the organic EL device may be selected in accordance with the applications of the organic EL device, and the back electrode is preferably disposed on the organic thin films (the organic electroluminescence layer). The back electrode may be formed on the whole surface or a part of the organic thin films. Further, a dielectric layer may be disposed between the back electrode and the organic thin films. The dielectric layer may be composed of an alkaline metal fluoride or an alkaline earth metal fluoride, and may have a thickness of 0.1 to 5 nm. The dielectric layer may be formed by a vacuum deposition method, a spattering method, an ion-plating method, etc.

The thickness of the back electrode may be properly selected depending on the material. The thickness is generally 10 nm to 5 µm, preferably 50 nm to 1 µm. The back electrode may be transparent or opaque. In the case of using the network conductor for the negative electrode, the back electrode is preferably transparent. The transparent back electrode may be formed by forming a thin layer of the above-mentioned material having a thickness of 1 to 10 nm, and by forming a transparent conductive layer of ITO, IZO, etc. on the thin layer.

(4) Organic Thin Films (Organic Electroluminescence Layer)

The organic electroluminescence layer may comprise the light-emitting organic thin film, the electron-transporting organic thin film, the hole-transporting organic thin film, the electron-injecting thin film, and/or the hole-injecting thin film, etc. The organic electroluminescence layer may further comprise various layers to increase the light-emitting properties as the organic thin films. Examples of materials for each thin film are described in "Organic EL Display" (Technotimes Co., Separate Volume of "Monthly Display", the October issue of 1998), etc. The organic thin films may contain a polymer binder, and thus the organic thin films can be easily formed by wet methods. The organic thin films may be patterned by a masking vacuum deposition, an ink-jet method, a printing method, a transferring method, etc.

(4-1) Light-emitting Organic Thin Film

The light-emitting organic thin film contains at least one light-emitting compound. The light-emitting compound is not particularly limited and may be a fluorescent compound or a phosphorescent compound. The fluorescent compound and the phosphorescent compound may be used in combination. In the present invention, the light-emitting organic thin film preferably contains the phosphorescent compound from the viewpoints of the light-emitting brightness and the light-emitting efficiency.

Examples of the fluorescent compounds include benzoxazole derivatives, benzoimidazole derivatives, benzothiazole derivatives, styrylbenzene derivatives, polyphenyl derivatives, diphenylbutadiene derivatives, tetraphenylbutadiene derivatives, naphthalimido derivatives, coumarin derivatives, perylene derivatives, perynone derivatives, oxadiazole derivatives, aldazine derivatives, pyralidine derivatives, cyclopentadiene derivatives, bis(styryl)anthracene derivatives, quinacridon derivatives, pyrrolopyridine derivatives, thiadiazolopyridine derivatives, styrylamine derivatives, aromatic dimethylidine compounds, metal complexes (e.g. 8-quinolinol derivative-metal complexes, rare-earth metal complexes, etc.), light-emitting polymer materials (e.g. polythiophene, polyphenylene, polyphenylenevinylene, polyfluorene, derivatives thereof, etc.) The fluorescent compounds may be used alone or as a mixture.

The phosphorescent compound preferably a compound utilizing triplet excitons for light emission, more preferably an ortho-metallation complex or a porphyrin complex. The porphyrin complex is preferably a porphyrin-platinum complex. The phosphorescent compound may be used singly and a plurality of the phosphorescent compounds may be used in combination.

The ortho-metallation complex used in the present invention may be a compound described in Akio Yamamoto, "*Yukikinzoku-Kagaku, Kiso to Oyo (Metalorganic Chemistry, Foundation and Application)*", pages 150 to 232, Shokabo Publishing Co., Ltd., (1982); H. Yersin, "*Photochemistry and Photophysics of Coordination Compounds*", pages 71 to 77 and 135 to 146, Springer-Verlag, Inc. (1987); etc. The ligands of the ortho-metallation complex are not particularly limited. Examples of the preferred ligands include 2-phenylpyridine derivatives, 7,8-benzoquinoline derivatives, 2-(2-thienyl)pyridine derivatives, 2-(1-naphthyl)pyridine derivatives, and 2-phenylquinoline derivatives. These derivatives may have a substituent. The ortho-metallation complex may have a ligand other than the essential ligands. The central metal of the ortho-metallation complex may be a transition metal, and preferably rhodium, platinum, gold, iridium, ruthenium, or palladium. The organic thin film containing such an ortho-metallation complex is excellent in the light-emitting brightness and the light-emitting efficiency. Specific examples of the ortho-metallation complexes are described also in JP 2002-319491 A, paragraphs 0201 to 0231.

The ortho-metallation complex used in the present invention may be synthesized by a known method described in *Inorg. Chem.*, 1991, No. 30, Page 1685; ibid., 1988, No. 27, Page 3464; ibid., 1994, No. 33, Page 545; *Inorg. Chim. Acta.*, 1991, No. 181, Page 245; *J. Organomet. Chem.*, 1987, No. 335, Page 293; *J. Am. Chem. Soc.*, 1985, No. 107, Page 1431; etc.

The mass ratio of the light-emitting compound in the light-emitting organic thin film is not particularly limited. The mass ratio is preferably 0.1 to 70% by mass, more preferably 1 to 20% by mass. If the mass ratio is less than 0.1% by mass or more than 70% by mass, there is a case where the light-emitting compound cannot achieve sufficient effect.

The light-emitting organic thin film may contain a host compound, a hole-transporting material, an electron-transporting material, an electrically inactive polymer binder, etc. if necessary.

When the host compound is converted into excitation state, energy is transferred from the excited host compound to the light-emitting compound, and as a result, the light-emitting compound emits light. Specific examples of the host compounds include carbazole derivatives; triazole derivatives; oxazole derivatives; oxadiazole derivatives; imidazole derivatives; polyarylalkane derivatives; pyrazoline derivatives; pyrazolone derivatives; phenylenediamine derivatives; arylamine derivatives; amino-substituted chalcone derivatives; styrylanthracene derivatives; fluorenone derivatives; hydrazone derivatives; stilbene derivatives; silazane derivatives; aromatic tertiary amine compounds; styrylamine compounds; aromatic dimethylidyne compounds; porphyrin compounds; anthraquinodimethane derivatives; anthrone derivatives; diphenylquinone derivatives; thiopyran dioxide derivatives; carbodimide derivatives; fluorenylidenemethane derivatives; distyrylpyrazine derivatives; heterocyclic tetracarboxylic acid anhydrides such as naphthaleneperylene derivatives; phthalocyanine derivatives; metal complexes of 8-quinolinol. derivatives, etc.; metallophthalocyanines; metal complexes containing a benzoxazole ligand or a benzothiazole ligand, etc.; polysilane compounds; poly(N-vinylcarbazole) derivatives; aniline copolymers; thiophene oligomers; conductive polymers such as polythiophenes; polythiophene derivatives; polyphenylene derivatives; polyphenylenevinylene derivatives; polyfluorene derivatives; etc. The host compounds may be used singly or in combination.

The hole-transporting material is not particularly limited and may be a low molecular weight material or a high molecular weight material, as long as it has a function of injecting the holes provided from the positive electrode into the light-emitting organic thin film; transporting the holes; or blocking the electrons provided from the negative electrode. Specific examples of the hole-transporting materials include carbazole derivatives; triazole derivatives; oxazole derivatives; oxadiazole derivatives; imidazole derivatives; polyarylalkane derivatives; pyrazoline derivatives; pyrazolone derivatives; phenylenediamine derivatives; arylamine derivatives; amino-substituted chalcone derivatives; styrylanthracene derivatives; fluorenone derivatives; hydrazone derivatives; stilbene derivatives; silazane derivatives; aromatic tertiary amine compounds; styrylamine compounds; aromatic dimethylidyne compounds; porphyrin compounds; polysilane compounds; poly(N-vinylcarbazole) derivatives; aniline copolymers; thiophene oligomers; conductive polymers such as polythiophenes; polythiophene derivatives; polyphenylene derivatives; polyphenylenevinylene derivatives; polyfluorene derivatives; etc. The hole-transporting materials may be used singly or in combination.

The electron-transporting material are not particularly limited as long as it has a function of injecting the electrons provided from the negative electrode into the light-emitting organic thin film; transporting the electrons; or blocking the holes provided from the positive electrode. Specific examples of the electron-transporting materials include triazole derivatives; oxazole derivatives; oxadiazole derivatives; fluorenone derivatives; anthraquinodimethane derivatives; anthrone derivatives; diphenylquinone derivatives; thiopyran dioxide derivatives; carbodimide derivatives; fluorenylidenemethane derivatives; distyrylpyrazine derivatives; heterocyclic tetracarboxylic acid anhydrides such as naphthaleneperylene derivatives; phthalocyanine derivatives; metal complexes of 8-quinolinol derivatives, etc.; metallophthalocyanines; metal complexes containing a benzoxazole ligand or a benzothiazole ligand, etc.; aniline copolymers; thiophene oligomers; conductive polymers such as polythiophenes; polythiophene derivatives; polyphenylene derivatives; polyphenylenevinylene derivatives; polyfluorene derivatives; etc.

Examples of the electrically inactive polymer binder include polyvinyl chlorides, polycarbonates, polystyrenes, poly(methyl methacrylates), poly(butyl methacrylates), polyesters, polysulfones, polyphenylene oxides, polybutadienes, hydrocarbon resins, ketone resins, phenoxy resins, polyamides, ethylcelluloses, poly(vinyl acetates), ABS resins, polyurethanes, melamine resins, unsaturated polyesters, alkyd resins, epoxy resins, silicone resins, polyvinylbutyrals, polyvinyl acetals, etc. The light-emitting organic thin film containing the polymer binder can be easily formed by a wet method into a large area.

Thickness of the light-emitting organic thin film is preferably 10 to 200 nm, more preferably 20 to 80 nm. When the thickness is more than 200 nm, the organic EL device occasionally needs a high driving voltage. On the other hand, when the thickness is less than 10 nm, there is a case where the organic EL device short-circuits.

(4-2) Hole-transporting Organic Thin Film

The organic EL device may have the hole-transporting organic thin film comprising the hole-transporting material described in (4-1) if necessary. The hole-transporting organic thin film may further contain the polymer binder described in (4-1). The thickness of the hole-transporting organic thin film is preferably 10 to 200 nm, more preferably 20 to 80 nm. When the thickness is more than 200 nm, the organic EL device often needs a higher driving voltage. When the thickness is less than 10 nm, there is a case where the organic EL device short-circuits.

(4-3) Electron-transporting Organic Thin Film

The organic EL device may have the electron-transporting organic thin film comprising the electron-transporting material described in (4-1) if necessary. The electron-transporting organic thin film may further contain the polymer binder described in (4-1). The thickness of the electron-transporting organic thin film is preferably 10 to 200 nm, more preferably 20 to 80 nm. When the thickness is more than 200 nm, the organic EL device occasionally needs a higher driving voltage. When the thickness is less than 10 nm, there is a case where the organic EL device short-circuits.

(5) Other Layers

The organic EL device preferably comprises a protective layer or a sealing layer to prevent the reduction of the light-emitting properties. In the case where the light-emitting lamination structure is formed by using a transfer material, a peelable layer may be formed between a temporary substrate and the organic thin films, and an adhesive layer may be formed between the organic thin films and a surface of the transparent conductive layer, etc., onto which the organic thin films are transferred, to increase the transferability, unless these layers affect the light-emitting properties.

(5-1) Protective Layer

The protective layer may be such as described in JP 7-85974 A, JP 7-192866 A, JP 8-22891 A, JP 10-275682 A, JP 10-106746 A, etc. The protective layer is generally disposed on the uppermost surface of the organic EL device. In the case where the network conductor-having substrate, the transparent conductive layer, the organic thin films, and the back electrode are disposed in this order, the uppermost surface is the outer surface of the back electrode. Further, in the case where the network conductor-having substrate, the back electrode, the organic thin films, and the transparent conductive layer are disposed in this order, the uppermost surface is the outer surface of the transparent conductive layer. The shape, size, and thickness of the protective layer are not particularly restricted. The protective layer may be composed of any material that can prevent a substance such as water and oxygen, which degrade the organic EL device, from entering or penetrating into the device. For example, the protective layer may be composed of silicon oxide, silicon dioxide, germanium oxide, germanium dioxide, etc.

Methods for forming the protective layer are not particularly restricted. The protective layer may be formed by a vacuum deposition method, a sputtering method, an activated sputtering method, a molecular beam epitaxy method, a cluster ion beam method, an ion-plating method, a plasma polymerization method, a plasma CVD method, a laser CVD method, a thermal CVD method, a coating method, etc.

(5-2) Sealing Layer

It is preferred that the sealing layer is formed in the organic EL device to prevent the permeation of water or oxygen. Examples of the materials for the sealing layer include copolymers of tetrafluoroethylene and at least one comonomer; fluorine-containing copolymers having a cyclic structure in the main chain; polyethylenes; polypropylenes; poly(methyl methacrylates); polyimides; polyureas; polytetrafluoroethylenes; polychlorotrifluoroethylenes; polydichlorodifluoroethylenes; copolymers of chlorotrifluoroethylene or dichlorodifluoroethylene, and another comonomer; moisture-absorbing substances having a water absorption of 1% or more; moisture-resistant substances having a water absorption of 0.1% or less; metals such as In, Sn, Pb, Au, Cu, Ag, Al, Ti and Ni; metal oxides such as MgO, SiO, $Sio_2$, $Al_2O_3$, GeO, NiO, CaO, BaO, $Fe_2O_3$, $Y_2O_3$ and $TiO_2$; metal fluorides such as $MgF_2$, LiF, $AlF_3$ and $CaF_2$; liquid fluorinated carbons such as perfluoroalkanes, perfluoroamines and perfluoroethers; liquids prepared by dispersing adsorbents for adsorbing moisture or oxygen in the liquid fluorinated carbons; etc.

(6) Sealing Member

In the organic EL device of the present invention, at least the organic thin films are preferably sealed by a sealing member such as a sealing plate and a sealing vessel to shield the device from penetration of moisture, oxygen, etc. The sealing member may be disposed only on the back electrode side, or the entire organic EL device may be covered with the sealing member, as long as the sealing member can seal at least the organic thin films. The shape, size, and thickness of the sealing member are not particularly restricted as long as the sealing member can seal and shield the organic thin films from the external air. Examples of the materials for the sealing member include glasses; stainless steels; metals such as aluminum; plastics such as poly(chlorotrifluoroethylenes), polyesters, and polycarbonates; and ceramics.

A sealing agent (or an adhesive) may be used when the sealing member is disposed on the light-emitting lamination structure. In the case of covering the entire light-emitting lamination structure with the sealing member, portions of the sealing member may be heat-welded without the sealing agent. Ultraviolet-hardening resins, heat-hardening resins, two-part type hardening resins, etc. are usable as the sealing agent.

A water-absorbing agent or an inert liquid may be interposed between the organic EL device and the sealing members. The water-absorbing agent is not particularly restricted, and specific examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieves, zeolite, magnesium oxide, etc. Examples of the inert liquids include paraffins; liquid paraffins; fluorine-based solvents such as perfluoroalkanes, perfluoroamines, and perfluoroethers; chlorine-based solvents; silicone oils; etc.

The present invention will be described in more detail below with reference to Examples without intention of restricting the scope of the present invention.

EXAMPLE 1

Production of Network Conductor-having Substrate (1) Preparation of Plated Underlayer Palladium chloride was reduced by sodium borohydride in a dispersion solvent of heptane/water to obtain a dispersion liquid of Pd metal particles having the average particle size of 5 nm. 5% by mass of polymethyl methacrylate was added to the dispersion liquid based on 100% by mass of the Pd metal particles, and diluted with toluene to prepare a coating liquid. A 50 μm (thickness)×25 mm×25 mm in size of a substrate made of ZEONOR 1020R available from Zeon Corporation was subjected to a corona discharge treatment, and the coating liquid was applied by a spin coater to the substrate, to form a plated underlayer. Then, the plated underlayer was subjected to an alkali edging treatment using 2N aqueous sodium hydroxide solution at 70° C. for 1 hour.

(2) Preparation of Sol-gel Film

Figure 3:
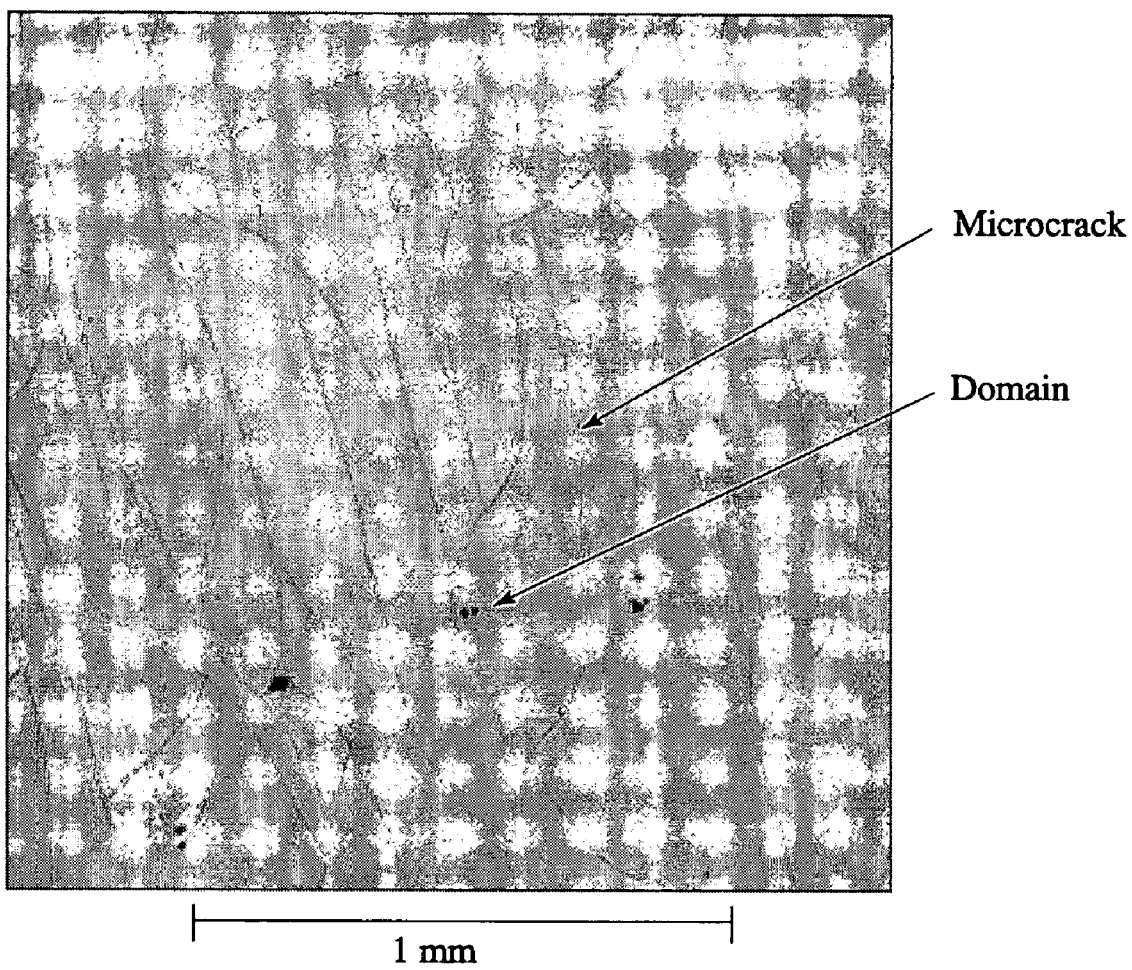
FIG. 3 is an optical micrograph of 55 magnifications showing the surface of the sol-gel film of the network conductor-having substrate produced in Example 1.

Water, hydrochloric acid, and propyl alcohol were added to tetraethoxysilicate and stirred at ambient temperature for 30 minutes to hydrolyze the tetraethoxysilicate. The obtained hydrolysate liquid was applied by a rod coater to the plated underlayer obtained in (1), and dried at 120° C. for 30 minutes to form a sol-gel film. The sol-gel film had the thickness of 0.4 μm after the drying. FIG. 3 is an optical micrograph of 55 magnifications showing the surface of the sol-gel film. As shown in FIG. 3, the sol-gel film was cracked, and microcracks and domains surrounded by the microcracks were observed.

(3) Plating Treatment

The substrate with the sol-gel film obtained in (2) was treated with an $NaAg(CN)_2$ electroless plating liquid using dimethylamine borane as a reducing agent and NaCN as a complexing agent at 50° C. for 10 minutes. After the electroless plating treatment, a little silver luster was observed in the surface of the sol-gel film. The resultant film had the sheet resistance of 2 Ω/square and the light transmittance of 81% measured by a spectrophotometer. As a result of observing the film by an electron microscope, the microcracks were filled with silver to form a network conductor.

EXAMPLE 2

Production of Organic EL Device

A transparent conductive layer of indium tin oxide (ITO, indium/tin=95/5 by mol) was formed into the 0.2 μm thickness by a sputtering method using a direct-current power source on the sol-gel film containing the network conductor of the network conductor-having substrate obtained in Example 1. Thus, a positive electrode comprising the network conductor layer of silver and the transparent conductive layer of ITO was obtained. The positive electrode had the surface resistance of 4 Ω/square. A dichloroethane solution of a composition of polyvinyl carbazole/1,1,4,4-tetraphenylbutadiene (blue light-emitting material)/tris(2-phenylpyridine) iridium complex (green light-emitting material of ortho-metallation complex)/4-(dicyanomethylene)-2-methyl-6-(4-dimethylaminostyryl)-4H-pyran (red light-emitting material)/2-(4-biphenylyl)-5-(4-t-butylphenyl)-1,3,4-oxadiazole (electron-transporting material)=200/ 1/5/1/50 (weight ratio) was applied by a spin coater onto the positive electrode, to form a light-emitting organic thin film having the thickness of 0.11 μm. Then, a mask patterned for a light-emitting area of 5 mm×5 mm was placed on the light-emitting organic thin film, a magnesium-silver alloy (mol ratio: magnesium/silver=10/1) was vapor-deposited thereon to 0.25 μm thickness, and silver was further vapor-deposited thereon to 0.3 μm thickness in a deposition apparatus, to form a negative electrode. Aluminum lead wires were connected to the positive electrode and the negative electrode to prepare a light-emitting laminate.

The resulting light-emitting laminate was put in a glove box replaced with nitrogen gas, and sealed with a sealing glass vessel by an ultraviolet-hardening adhesive XNR5493 available from Nagase-Chiba Co. to produce an organic EL device. Direct voltage was applied to the organic EL device by Source-Measure Unit 2400 available form Toyo Corporation, and as a result, the organic EL device emitted a white light.

COMPARATIVE EXAMPLE 1

A positive electrode of ITO was formed in the same manner as in Example 2 on a substrate with the size of 50 μm×25 mm×25 mm of ZEONOR 1020R, which was the same as the substrate used in Example 1, to produce a network conductor-having substrate. The positive electrode had the surface resistance of 10 Ω/square.

As described above, the ITO positive electrode formed on the network conductor-having substrate in Example 2 had the surface resistance of 4 Ω/square. On the contrary, the ITO positive electrode formed on the substrate without a network conductor in Comparative Example 1 had the surface resistance of 10 Ω/square. Thus, it was clear that the structure according to the present invention was excellent in the surface resistance.

EXAMPLE 3

Production of Network Conductor-having Substrate (1) Preparation of Bondable Underlayer 1 g of 3-mercaptopropyltrimethoxysilane was added to 100 ml of an aqueous solution containing 1% by mass of acetic acid, and stirred to make the resultant mixture uniform. The obtained sol liquid was applied by a spin coater onto a glass substrate having a size of 0.7 mm in thickness× 25 mm×25 mm, and heated at 120° C. for 1 hour, to form a bondable underlayer.

(2) Preparation of Sol-gel Film

A sol-gel film was formed on the bondable underlayer obtained in (1) in the same manner as in Example 1. The sol-gel film had the thickness of 0.4 μm after drying. As a result of observing the sol-gel film by an optical microscope, the sol-gel film was cracked, and microcracks and domains surrounded by the microcracks were found.

(3) Preparation of Conductive Particles

An aqueous sodium citrate solution as a reducing agent was added to an aqueous chloroauric (III) acid solution, and the mixture was heated and stirred at 80° C. for 1 hour to prepare red-colored, colloidal gold particles. The gold particles had the average particle size of 50 nm.

(4) Filling of Conductive Particles

The substrate with the sol-gel film obtained in (2) was soaked at the room temperature overnight in the aqueous dispersion liquid of the gold particles (concentration: 0.1% by mass) obtained in (3). The resultant substrate was removed from the dispersion liquid, dried at the room temperature, and burned at 300° C. for 1 hour. As a result of observing the resulting surface by an electron microscope, it was clear that the gold particles were adsorbed to the bondable underlayer in the microcracks into a single-layer, to form a network conductor. The obtained network conductor-having substrate had the sheet resistance of 3 Ω/square and the light transmittance of 80% measured by a spectrophotometer.

EXAMPLE 4

Production of Organic EL Device

A transparent conductive layer of indium tin oxide (ITO, indium/tin=95/5 by mol) was formed in the 0.2 μm thickness by a sputtering method using a direct-current power source on the sol-gel film containing the network conductor obtained in Example 3. Thus, a positive electrode comprising the network conductor layer of gold and the transparent conductive layer of ITO was obtained. The positive electrode had the surface resistance of 8 Ω/square and the light transmittance of 86% measured by a spectrophotometer. A light-emitting organic thin film having the thickness of 0.11 μm was formed on the positive electrode in the same manner as in Example 2. Then, a negative electrode, which comprised a magnesium-silver alloy layer having the thickness of 0.25 μm (mol ratio:magnesium/silver=10/1) and a silver layer having the thickness of 0.3 μm, was formed on the light-emitting organic thin film in the same manner as in Example 2. Aluminum lead wires were connected to the positive electrode and the negative electrode to prepare a light-emitting laminate.

The resulting light-emitting laminate was sealed with a sealing glass vessel in the same manner as in Example 2 to produce an organic EL device. Direct voltage was applied to the organic EL device by Source-Measure Unit 2400 available form Toyo Corporation, and as a result, the organic EL device emitted a white light.

COMPARATIVE EXAMPLE 2

A positive electrode of ITO was formed in the same manner as in Example 4 on a glass substrate, which was the same as the substrate used in Example 3, to produce a network conductor-having substrate. The positive electrode had the surface resistance of 10 Ω/square and the light transmittance of 70%.

As described above, the positive electrode formed on the network conductor-having substrate in Example 4 had the surface resistance of 8 Ω/square and the light transmittance of 86%. On the contrary, the ITO positive electrode formed on the substrate without a network conductor in Comparative Example 2 had the surface resistance of 10 Ω/square and the light transmittance of 70%. Thus, it was clear that the structure according to the present invention was excellent in the surface resistance and the light transmittance.

EXAMPLE 5

Production of Positive Electrode with Network Conductor (1) Preparation of Plated Underlayer Sodium chloroaurate (III) was reduced by sodium borohydride in a dispersion solvent of heptane/water to obtain a dispersion liquid of gold particles having the average particle size of 5 nm. 5% by mass of polybutyl methacrylate was added to the dispersion liquid based on 100% by mass of the gold particles, and diluted with toluene to prepare a coating liquid. The coating liquid was applied by a spin coater onto a 0.7 mm (thickness)×25 mm×25 mm in size of a glass substrate to form a plated underlayer. Then, the plated underlayer was subjected to a corona discharge treatment.

(2) Preparation of Sol-gel Film

A sol-gel film was formed on the plated underlayer obtained in (1) in the same manner as in Example 1. The sol-gel film had the thickness of 0.4 µm after drying. As a result of observing the sol-gel film by an optical microscope, the sol-gel film was cracked, and microcracks and domains surrounded by the microcracks were found.

(3) Plating Treatment

The substrate with the sol-gel film obtained in (2) was treated with a sodium chloroaurate (III) electroless plating liquid using dimethylamine borane as a reducing agent and NaCN as a complexing agent at 50° C. for 10 minutes. After the electroless plating treatment, a little gold luster was observed in the surface of the sol-gel film. The resultant film had the sheet resistance of 3 Ω/square and the light transmittance of 83% measured by a spectrophotometer. As a result of observing the film by an electron microscope, the microcracks were filled with gold to form a network conductor.

(4) Preparation of Conductive Polymer Layer

A polyethylene dioxythiophene/polystyrenesulfone dispersion (BAYTRON P A1 4083, available form Bayer Co.) was applied by a spin coater into 50 nm thickness to the network conductor obtained in (3), and dried under reduced pressure at 150° C. for 1 hour to form a positive electrode. The positive electrode had the surface resistance of 3 Ω/square and the light transmittance of 82%.

EXAMPLE 6

Production of Organic EL Device

A light-emitting organic thin film having the thickness of 0.11 µm was formed on the positive electrode of the network conductor-having substrate obtained in Example 5, in the same manner as in Example 2. Then, a negative electrode, which comprised a magnesium-silver alloy layer having the thickness of 0.25 µm (mol ratio:magnesium/silver=10/1) and a silver layer having the thickness of 0.3 µm, was formed on the light-emitting organic thin film in the same manner as in Example 2. Aluminum lead wires were connected to the positive electrode and the negative electrode to prepare a light-emitting laminate.

The resulting light-emitting laminate was sealed with a sealing glass vessel in the same manner as in Example 2 to produce an organic EL device. Direct voltage was applied to the organic EL device by Source-Measure Unit 2400 available form Toyo Corporation, and as a result, the organic EL device emitted a white light at a driving voltage of 9 V or more.

COMPARATIVE EXAMPLE 3

A positive electrode of ITO was formed in the same manner as in Example 4 on a glass substrate, which was the same as the substrate used in Example 5, to produce a network conductor-having substrate. The positive electrode had the surface resistance of 10 Ω/square and the light transmittance of 70%. An organic EL device was produced from the network conductor-having substrate in the same manner as in Example 6. As a result of applying a direct current voltage to the organic EL device, the organic EL device emitted a light at a driving voltage of 15 V or more.

As described above, the positive electrode of ITO formed on the network conductor-having substrate of Example 5 had the surface resistance of 3 Ω/square and the light transmittance of 82%. Further, the organic EL device of Example 6 using the network conductor-having substrate of Example 5 emitted a light at a driving voltage of 9 V or more. On the contrary, the positive electrode of ITO formed on the substrate without a network conductor in Comparative Example 3 had the surface resistance of 10 Ω/square and the light transmittance of 70%. Further, the organic EL device of Comparative Example 3 emitted a light at a driving voltage of 15 V or more. Thus, it was clear that the structure according to the present invention was excellent in the surface resistance, the light transmittance, and the light-emitting properties.

As described in detail above, the network conductor of the present invention having a network structure with as thin lines as 10 nm to 10 µm, thereby showing excellent charge injection property, low resistivity, and high light transmittance. Further, because the network conductor is formed by utilizing natural phenomenon of cracking of the thin film, the network conductor can be produced with relatively low energy costs. Thus, in the case where the network conductor-having substrate comprising the network conductor of the present invention is used in an electrode of an organic EL device, the organic EL device can be driven with reduced heat generation and uniform brightness. The network conductor and the network conductor-having substrate of the present invention are useful for display devices such as organic EL devices and liquid crystal displays, leakage electromagnetic wave-shielding films of display devices, transparent electrodes of electron devices, etc. The organic EL device of the present invention is useful for backlights of liquid crystal displays, etc.

What is claimed is:

1. A method for producing a network conductor comprising forming a thin film on a substrate; generating microcracks in a pattern of branching lines in said thin film; and filling said microcracks with a conductive material.

2. The method of claim 1, wherein said thin film is (1) a sol-gel film obtained by applying a sol-gel liquid, (2) a fine particle film obtained by applying a fine particles-containing liquid, or (3) a vapor deposition film obtained by depositing a vaporized thin film-forming material; and wherein said microcracks are generated by drying said sol-gel film or said fine particle film, or by causing stress to be stored in said vapor deposition film during its growth.

3. The method of claim 1, comprising forming said thin film after forming an underlayer by a plating method on said substrate, and forming said conductive material layer by a plating method on portions of said plated underlayer exposed to said microcracks.

4. The method of claim 3, wherein said plating method is an electroless plating method; and wherein said plated underlayer comprises a plating catalyst or a catalyst precursor.

5. The method of claim 1, comprising forming said thin film after forming a bondable underlayer having bondability to said conductive material or acquiring bondability to said conductive material by activation on said substrate, and bonding particles of said conductive material to portions of said bondable underlayer exposed to said microcracks.

6. The method of claim 5, wherein said bondable underlayer has a functional group bondable to said conductive material or a functional group acquiring bondability to said conductive material by activation.

7. The method of claim 1, wherein said pattern of branching lines comprises lines from 10 nm to 10 μm.

8. The method of claim 1, wherein said thin film is removed after forming said network conductor.

9. A method for producing a network conductor comprising forming an underlayer on a substrate; forming a thin film on said underlayer, generating microcracks in a pattern of branching lines in said thin film; activating portions of said underlayer exposed to said microcracks; removing said thin film; and forming a layer of a conductive material only on the activated portions of said underlayer.

10. The method of claim 9, wherein said thin film is (1) a sol-gel film obtained by applying a sol-gel liquid, (2) a fine particle film obtained by applying a fine particles-containing liquid, or (3) a vapor deposition film obtained by depositing a vaporized thin film-forming material; and wherein said microcracks are generated by drying said sol-gel film or said fine particle film, or by causing stress to be stored in said vapor deposition film during its growth.

11. The method of claim 9, comprising forming said thin film after forming an underlayer by a plating method on said substrate, activating portions of said plated underlayer exposed to said microcracks, and forming said conductive material layer by a plating method on the activated portions of said plated underlayer.

12. The method of claim 11, wherein said plating method is an electroless plating method; and wherein said plated underlayer comprises a plating catalyst or a catalyst precursor.

13. The method of claim 9, comprising forming said thin film after forming a bondable underlayer having bondability to said conductive material or acquiring bondability to said conductive material by activation on said substrate, activating portions of said bondable underlayer exposed to said microcracks, and bonding particles of said conductive material to the activated portions of said bondable underlayer.

14. The method of claim 13, wherein said bondable underlayer has a functional group bondable to said conductive material or a functional group acquiring bondability to said conductive material by activation.

15. The method of claim 9, wherein said pattern of branching lines comprises lines from 10 nm to 10 μm.

16. The method of claim 9, wherein said thin film is removed after forming said network conductor.

* * * * *